United States Patent
Boone et al.

(10) Patent No.: US 11,621,293 B2
(45) Date of Patent: Apr. 4, 2023

(54) MULTI TERMINAL DEVICE STACK SYSTEMS AND METHODS

(71) Applicant: Integrated Silicon Solution, (Cayman) Inc., Grand Cayman (KY)

(72) Inventors: Thomas Boone, Fremont, CA (US); Pradeep Manandhar, Fremont, CA (US); Girish Jagtini, Fremont, CA (US); Yuan-Tung Chin, Fremont, CA (US); Elizabeth Dobisz, Fremont, CA (US); Mustafa Pinarbasi, Fremont, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 328 days.

(21) Appl. No.: 16/148,223

(22) Filed: Oct. 1, 2018

(65) Prior Publication Data
US 2020/0105829 A1 Apr. 2, 2020

(51) Int. Cl.
*H01L 27/22* (2006.01)
*H01L 43/12* (2006.01)
*H01L 43/02* (2006.01)

(52) U.S. Cl.
CPC ............ *H01L 27/222* (2013.01); *H01L 43/12* (2013.01); *H01L 43/02* (2013.01)

(58) Field of Classification Search
CPC ........ H01L 27/222; H01L 43/12; H01L 43/02
See application file for complete search history.

(56) References Cited

U.S. PATENT DOCUMENTS

| | | | |
|---|---|---|---|
| 4,597,487 | A | 7/1986 | Crosby et al. |
| 5,541,868 | A | 7/1996 | Prinz |
| 5,559,952 | A | 9/1996 | Fujimoto |
| 5,629,549 | A | 5/1997 | Johnson |
| 5,640,343 | A | 6/1997 | Gallagher et al. |

(Continued)

FOREIGN PATENT DOCUMENTS

| | | |
|---|---|---|
| CA | 2766141 | 1/2011 |
| CN | 105706259 | 6/2016 |

(Continued)

OTHER PUBLICATIONS

US 7,026,672 B2, 04/2006, Grandis (withdrawn)

(Continued)

*Primary Examiner* — Xiaoming Liu

(57) ABSTRACT

Embodiments of the present invention include multiple independent terminals for a plurality of devices in a stack configuration within a semiconductor. In one embodiment, a semiconductor comprises: a first device at a first semiconductor level within a multi terminal device stack; wherein the first device is coupled to a first terminal; a second device at a second semiconductor level within the multi terminal device stack, wherein the second device is coupled to a second terminal; and a third terminal is coupled to the first device, wherein the first terminal and second terminal are independently coupled to the first device and second device respectively. The third terminal can be coupled to the second device. The first terminal, the second terminal, and third terminal and couple components included in the multi terminal stack to components not included in the multi terminal stack.

16 Claims, 34 Drawing Sheets

(56) References Cited

U.S. PATENT DOCUMENTS

| | | |
|---|---|---|
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Slonczewski |
| 5,732,016 A | 3/1998 | Chen et al. |
| 5,751,647 A | 5/1998 | O'Toole |
| 5,856,397 A | 1/1999 | Auri |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,064,948 A | 5/2000 | West |
| 6,075,941 A | 6/2000 | Itoh |
| 6,097,579 A | 8/2000 | Gill |
| 6,112,295 A | 8/2000 | Bhamidipati et al. |
| 6,124,711 A | 9/2000 | Tanaka et al. |
| 6,134,138 A | 10/2000 | Lu et al. |
| 6,140,838 A | 10/2000 | Johnson |
| 6,154,139 A | 11/2000 | Kanai et al. |
| 6,154,349 A | 11/2000 | Kanai et al. |
| 6,172,902 B1 | 1/2001 | Wegrowe et al. |
| 6,233,172 B1 | 5/2001 | Chen et al. |
| 6,233,690 B1 | 5/2001 | Choi et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,442,681 B1 | 8/2002 | Ryan et al. |
| 6,447,935 B1 | 9/2002 | Zhang et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,903 B1 | 4/2003 | Savtchenko et al. |
| 6,545,906 B1 | 4/2003 | Savtchenko |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,608,776 B2 | 8/2003 | Hidaka |
| 6,635,367 B2 | 10/2003 | Igarashi et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,731,537 B2 | 5/2004 | Kanamori |
| 6,744,086 B2 | 6/2004 | Daughton et al. |
| 6,750,491 B2 | 6/2004 | Sharma et al. |
| 6,751,074 B2 | 6/2004 | Inomata et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,785,159 B2 | 8/2004 | Tuttle |
| 6,807,091 B2 | 10/2004 | Saito |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,839,821 B2 | 1/2005 | Estakhri |
| 6,842,317 B2 | 1/2005 | Sugita et al. |
| 6,842,366 B2 | 1/2005 | Chan |
| 6,847,547 B2 | 1/2005 | Albert et al. |
| 6,879,512 B2 | 4/2005 | Luo |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,936,479 B2 | 8/2005 | Sharma |
| 6,938,142 B2 | 8/2005 | Pawlowski |
| 6,956,257 B2 | 10/2005 | Zhu et al. |
| 6,958,507 B2 | 10/2005 | Atwood et al. |
| 6,958,927 B1 | 10/2005 | Nguyen et al. |
| 6,967,363 B1 | 11/2005 | Huai |
| 6,967,863 B2 | 11/2005 | Huai |
| 6,980,469 B2 | 12/2005 | Kent et al. |
| 6,984,529 B2 | 1/2006 | Stojakovic et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,339 B2 | 2/2006 | Kawabata et al. |
| 7,002,839 B2 | 2/2006 | Kawabata et al. |
| 7,005,958 B2 | 2/2006 | Wan |
| 7,006,371 B2 | 2/2006 | Matsuoka |
| 7,006,375 B2 | 2/2006 | Covington |
| 7,009,877 B1 | 3/2006 | Huai et al. |
| 7,033,126 B2 | 4/2006 | Van Den Berg |
| 7,041,598 B2 | 5/2006 | Sharma |
| 7,045,368 B2 | 5/2006 | Hong et al. |
| 7,054,119 B2 | 5/2006 | Sharma et al. |
| 7,057,922 B2 | 6/2006 | Fukumoto |
| 7,095,646 B2 | 8/2006 | Slaughter et al. |
| 7,098,494 B2 | 8/2006 | Pakala et al. |
| 7,106,624 B2 | 9/2006 | Huai et al. |
| 7,110,287 B2 | 9/2006 | Huai et al. |
| 7,149,106 B2 | 12/2006 | Mancoff et al. |
| 7,161,829 B2 | 1/2007 | Huai et al. |
| 7,170,778 B2 | 1/2007 | Kent et al. |
| 7,187,577 B1 | 3/2007 | Wang |
| 7,190,611 B2 | 3/2007 | Nguyen et al. |
| 7,203,129 B2 | 4/2007 | Lin et al. |
| 7,203,802 B2 | 4/2007 | Huras |
| 7,227,773 B1 | 6/2007 | Nguyen et al. |
| 7,233,039 B2 | 6/2007 | Huai et al. |
| 7,242,045 B2 | 7/2007 | Nguyen et al. |
| 7,245,462 B2 | 7/2007 | Huai et al. |
| 7,262,941 B2 | 8/2007 | Li et al. |
| 7,273,780 B2 | 9/2007 | Kim |
| 7,283,333 B2 | 10/2007 | Gill |
| 7,307,376 B2 | 12/2007 | Kent et al. |
| 7,307,876 B2 | 12/2007 | Kent et al. |
| 7,313,015 B2 | 12/2007 | Bessho |
| 7,324,387 B1 | 1/2008 | Bergemont et al. |
| 7,324,389 B2 | 1/2008 | Cernea |
| 7,335,960 B2 | 2/2008 | Han et al. |
| 7,351,594 B2 | 4/2008 | Bae et al. |
| 7,352,021 B2 | 4/2008 | Bae et al. |
| 7,369,427 B2 | 5/2008 | Dia et al. |
| 7,372,722 B2 | 5/2008 | Jeong |
| 7,376,006 B2 | 5/2008 | Bednorz et al. |
| 7,386,765 B2 | 6/2008 | Ellis |
| 7,404,017 B2 | 7/2008 | Kuo |
| 7,421,535 B2 | 9/2008 | Jarvis et al. |
| 7,436,699 B2 | 10/2008 | Tanizaki |
| 7,449,345 B2 | 11/2008 | Horng et al. |
| 7,453,719 B2 | 11/2008 | Sakimura |
| 7,476,919 B2 | 1/2009 | Hong et al. |
| 7,502,249 B1 | 3/2009 | Ding |
| 7,502,253 B2 | 3/2009 | Rizzo |
| 7,508,042 B2 | 3/2009 | Guo |
| 7,511,985 B2 | 3/2009 | Horii |
| 7,515,458 B2 | 4/2009 | Hung et al. |
| 7,515,485 B2 | 4/2009 | Lee |
| 7,532,503 B2 | 5/2009 | Morise et al. |
| 7,541,117 B2 | 6/2009 | Ogawa |
| 7,542,326 B2 | 6/2009 | Yoshimura |
| 7,573,737 B2 | 8/2009 | Kent et al. |
| 7,576,956 B2 | 8/2009 | Huai |
| 7,582,166 B2 | 9/2009 | Lampe |
| 7,598,555 B1 | 10/2009 | Papworth-Parkin |
| 7,602,000 B2 | 10/2009 | Sun et al. |
| 7,619,431 B2 | 11/2009 | DeWilde et al. |
| 7,633,800 B2 | 12/2009 | Adusumilli et al. |
| 7,642,612 B2 | 1/2010 | Izumi et al. |
| 7,660,161 B2 | 2/2010 | Van Tran |

(56) References Cited

U.S. PATENT DOCUMENTS

| | | | |
|---|---|---|---|
| 7,663,171 | B2 | 2/2010 | Inokuchi et al. |
| 7,675,792 | B2 | 3/2010 | Bedeschi |
| 7,696,551 | B2 | 4/2010 | Xiao |
| 7,733,699 | B2 | 6/2010 | Roohparvar |
| 7,739,559 | B2 | 6/2010 | Suzuki et al. |
| 7,773,439 | B2 | 8/2010 | Do et al. |
| 7,776,665 | B2 | 8/2010 | Izumi et al. |
| 7,796,439 | B2 | 9/2010 | Arai et al. |
| 7,810,017 | B2 | 10/2010 | Radke |
| 7,821,818 | B2 | 10/2010 | Dieny et al. |
| 7,852,662 | B2 | 12/2010 | Yang |
| 7,861,141 | B2 | 12/2010 | Chen |
| 7,881,095 | B2 | 2/2011 | Lu |
| 7,911,832 | B2 | 3/2011 | Kent et al. |
| 7,916,515 | B2 | 3/2011 | Li |
| 7,936,595 | B2 | 5/2011 | Han et al. |
| 7,936,598 | B2 | 5/2011 | Zheng et al. |
| 7,983,077 | B2 | 7/2011 | Park |
| 7,986,544 | B2 | 7/2011 | Kent et al. |
| 8,008,095 | B2 | 8/2011 | Assefa et al. |
| 8,028,119 | B2 | 9/2011 | Miura |
| 8,041,879 | B2 | 10/2011 | Erez |
| 8,055,957 | B2 | 11/2011 | Kondo |
| 8,058,925 | B2 | 11/2011 | Rasmussen |
| 8,059,460 | B2 | 11/2011 | Jeong et al. |
| 8,072,821 | B2 | 12/2011 | Arai |
| 8,077,496 | B2 | 12/2011 | Choi |
| 8,080,365 | B2 | 12/2011 | Nozaki |
| 8,088,556 | B2 | 1/2012 | Nozaki |
| 8,094,480 | B2 | 1/2012 | Tonomura |
| 8,102,701 | B2 | 1/2012 | Prejbeanu et al. |
| 8,105,948 | B2 | 1/2012 | Zhong et al. |
| 8,120,949 | B2 | 2/2012 | Ranjan et al. |
| 8,143,683 | B2 | 3/2012 | Wang et al. |
| 8,144,509 | B2 | 3/2012 | Jung |
| 8,148,970 | B2 | 4/2012 | Fuse |
| 8,159,867 | B2 | 4/2012 | Cho et al. |
| 8,201,024 | B2 | 6/2012 | Burger |
| 8,223,534 | B2 | 7/2012 | Chung |
| 8,255,742 | B2 | 8/2012 | Ipek |
| 8,278,996 | B2 | 10/2012 | Miki |
| 8,279,666 | B2 | 10/2012 | Dieny et al. |
| 8,295,073 | B2 | 10/2012 | Norman |
| 8,295,082 | B2 | 10/2012 | Chua-Eoan |
| 8,334,213 | B2 | 12/2012 | Mao |
| 8,345,474 | B2 | 1/2013 | Oh |
| 8,349,536 | B2 | 1/2013 | Nozaki |
| 8,362,580 | B2 | 1/2013 | Chen et al. |
| 8,363,465 | B2 | 1/2013 | Kent et al. |
| 8,374,050 | B2 | 2/2013 | Zhou et al. |
| 8,386,836 | B2 | 2/2013 | Burger |
| 8,415,650 | B2 | 4/2013 | Greene |
| 8,416,620 | B2 | 4/2013 | Zheng et al. |
| 8,422,286 | B2 | 4/2013 | Ranjan et al. |
| 8,422,330 | B2 | 4/2013 | Hatano et al. |
| 8,432,727 | B2 | 4/2013 | Ryu |
| 8,441,844 | B2 | 5/2013 | El Baraji |
| 8,456,383 | B2 | 6/2013 | Liu |
| 8,456,926 | B2 | 6/2013 | Ong et al. |
| 8,477,530 | B2 | 7/2013 | Ranjan et al. |
| 8,492,381 | B2 | 7/2013 | Kuroiwa et al. |
| 8,492,881 | B2 | 7/2013 | Kuroiwa et al. |
| 8,495,432 | B2 | 7/2013 | Dickens |
| 8,535,952 | B2 | 9/2013 | Ranjan et al. |
| 8,539,303 | B2 | 9/2013 | Lu |
| 8,542,524 | B2 | 9/2013 | Keshtbod et al. |
| 8,549,303 | B2 | 10/2013 | Fifield et al. |
| 8,558,334 | B2 | 10/2013 | Ueki et al. |
| 8,559,215 | B2 | 10/2013 | Zhou et al. |
| 8,574,928 | B2 | 11/2013 | Satoh et al. |
| 8,582,353 | B2 | 11/2013 | Lee |
| 8,590,139 | B2 | 11/2013 | Op DeBeeck et al. |
| 8,592,927 | B2 | 11/2013 | Jan |
| 8,593,868 | B2 | 11/2013 | Park |
| 8,609,439 | B2 | 12/2013 | Prejbeanu et al. |
| 8,617,408 | B2 | 12/2013 | Balamane |
| 8,625,339 | B2 | 1/2014 | Ong |
| 8,634,232 | B2 | 1/2014 | Oh |
| 8,667,331 | B2 | 3/2014 | Hori |
| 8,687,415 | B2 | 4/2014 | Parkin et al. |
| 8,705,279 | B2 | 4/2014 | Kim |
| 8,716,817 | B2 | 5/2014 | Saida |
| 8,716,818 | B2 | 5/2014 | Yoshikawa et al. |
| 8,722,543 | B2 | 5/2014 | Belen |
| 8,737,137 | B1 | 5/2014 | Choy et al. |
| 8,755,222 | B2 | 6/2014 | Kent et al. |
| 8,779,410 | B2 | 7/2014 | Sato et al. |
| 8,780,617 | B2 | 7/2014 | Kang |
| 8,792,269 | B1 | 7/2014 | Abedifard |
| 8,802,451 | B2 | 8/2014 | Malmhall |
| 8,810,974 | B2 | 8/2014 | Noel et al. |
| 8,817,525 | B2 | 8/2014 | Ishihara |
| 8,832,530 | B2 | 9/2014 | Pangal et al. |
| 8,852,760 | B2 | 10/2014 | Wang et al. |
| 8,853,807 | B2 | 10/2014 | Son et al. |
| 8,860,156 | B2 | 10/2014 | Beach et al. |
| 8,862,808 | B2 | 10/2014 | Tsukamoto et al. |
| 8,867,258 | B2 | 10/2014 | Rao |
| 8,883,520 | B2 | 11/2014 | Satoh et al. |
| 8,902,628 | B2 | 12/2014 | Ha |
| 8,966,345 | B2 | 2/2015 | Wilkerson |
| 8,987,849 | B2 | 3/2015 | Jan |
| 9,019,754 | B1 | 4/2015 | Bedeschi |
| 9,025,378 | B2 | 5/2015 | Tokiwa |
| 9,026,888 | B2 | 5/2015 | Kwok |
| 9,030,899 | B2 | 5/2015 | Lee |
| 9,036,407 | B2 | 5/2015 | Wang et al. |
| 9,037,812 | B2 | 5/2015 | Chew |
| 9,043,674 | B2 | 5/2015 | Wu et al. |
| 9,070,441 | B2 | 6/2015 | Otsuka et al. |
| 9,070,855 | B2 | 6/2015 | Gan et al. |
| 9,076,530 | B2 | 7/2015 | Gomez et al. |
| 9,082,888 | B2 | 7/2015 | Kent et al. |
| 9,104,581 | B2 | 8/2015 | Fee et al. |
| 9,104,595 | B2 | 8/2015 | Sah |
| 9,130,155 | B2 | 9/2015 | Chepulskyy et al. |
| 9,136,463 | B2 | 9/2015 | Li |
| 9,140,747 | B2 | 9/2015 | Kim |
| 9,165,629 | B2 | 10/2015 | Chih |
| 9,165,787 | B2 | 10/2015 | Kang |
| 9,166,155 | B2 | 10/2015 | Deshpande |
| 9,178,958 | B2 | 11/2015 | Lindamood |
| 9,189,326 | B2 | 11/2015 | Kalamatianos |
| 9,190,471 | B2 | 11/2015 | Yi et al. |
| 9,196,332 | B2 | 11/2015 | Zhang et al. |
| 9,229,806 | B2 | 1/2016 | Mekhanik et al. |
| 9,229,853 | B2 | 1/2016 | Khan |
| 9,231,191 | B2 | 1/2016 | Huang et al. |
| 9,245,608 | B2 | 1/2016 | Chen et al. |
| 9,250,990 | B2 | 2/2016 | Motwani |
| 9,250,997 | B2 | 2/2016 | Kim et al. |
| 9,251,896 | B2 | 2/2016 | Ikeda |
| 9,257,483 | B2 | 2/2016 | Ishigaki |
| 9,263,667 | B1 | 2/2016 | Pinarbasi |
| 9,286,186 | B2 | 3/2016 | Weiss |
| 9,298,552 | B2 | 3/2016 | Leem |
| 9,299,412 | B2 | 3/2016 | Naeimi |
| 9,317,429 | B2 | 4/2016 | Ramanujan |
| 9,324,457 | B2 | 4/2016 | Takizawa |
| 9,337,412 | B2 | 5/2016 | Pinarbasi et al. |
| 9,341,939 | B1 | 5/2016 | Yu et al. |
| 9,342,403 | B2 | 5/2016 | Keppel et al. |
| 9,349,482 | B2 | 5/2016 | Kim et al. |
| 9,351,899 | B2 | 5/2016 | Bose et al. |
| 9,362,486 | B2 | 6/2016 | Kim et al. |
| 9,378,817 | B2 | 6/2016 | Kawai |
| 9,379,314 | B2 | 6/2016 | Park et al. |
| 9,389,954 | B2 | 7/2016 | Pelley et al. |
| 9,396,065 | B2 | 7/2016 | Webb et al. |
| 9,396,991 | B2 | 7/2016 | Arvin et al. |
| 9,401,336 | B2 | 7/2016 | Arvin et al. |
| 9,406,876 | B2 | 8/2016 | Pinarbasi |
| 9,418,721 | B2 | 8/2016 | Bose |
| 9,431,084 | B2 | 8/2016 | Bose et al. |

(56) References Cited

U.S. PATENT DOCUMENTS

| | | |
|---|---|---|
| 9,449,720 B1 | 9/2016 | Lung |
| 9,450,180 B1 | 9/2016 | Annunziata |
| 9,455,013 B2 | 9/2016 | Kim |
| 9,466,789 B2 | 10/2016 | Wang et al. |
| 9,472,282 B2 | 10/2016 | Lee |
| 9,472,748 B2 | 10/2016 | Kuo et al. |
| 9,484,527 B2 | 11/2016 | Han et al. |
| 9,488,416 B2 | 11/2016 | Fujita et al. |
| 9,490,054 B2 | 11/2016 | Jan |
| 9,508,456 B1 | 11/2016 | Shim |
| 9,520,128 B2 | 12/2016 | Bauer et al. |
| 9,520,192 B2 | 12/2016 | Naeimi et al. |
| 9,548,116 B2 | 1/2017 | Roy et al. |
| 9,548,445 B2 | 1/2017 | Lee et al. |
| 9,553,102 B2 | 1/2017 | Wang |
| 9,583,167 B2 | 2/2017 | Chung |
| 9,594,683 B2 | 3/2017 | Dittrich |
| 9,600,183 B2 | 3/2017 | Tornishima et al. |
| 9,608,038 B2 | 3/2017 | Wang et al. |
| 9,634,237 B2 | 4/2017 | Lee et al. |
| 9,640,267 B2 | 5/2017 | Tani |
| 9,646,701 B2 | 5/2017 | Lee |
| 9,652,321 B2 | 5/2017 | Motwani |
| 9,662,925 B2 | 5/2017 | Raksha et al. |
| 9,697,140 B2 | 7/2017 | Kwok |
| 9,720,616 B2 | 8/2017 | Yu |
| 9,728,712 B2 | 8/2017 | Kardasz et al. |
| 9,741,926 B1 | 8/2017 | Pinarbasi et al. |
| 9,772,555 B2 | 9/2017 | Park et al. |
| 9,773,974 B2 | 9/2017 | Pinarbasi et al. |
| 9,780,300 B2 | 10/2017 | Zhou et al. |
| 9,793,319 B2 | 10/2017 | Gan et al. |
| 9,853,006 B2 | 12/2017 | Arvin et al. |
| 9,853,206 B2 | 12/2017 | Pinarbasi et al. |
| 9,853,292 B2 | 12/2017 | Loveridge et al. |
| 9,858,975 B1* | 1/2018 | Hatcher .............. G11C 11/1675 |
| 9,858,976 B2 | 1/2018 | Ikegami |
| 9,859,333 B2 | 1/2018 | Kim et al. |
| 9,865,806 B2 | 1/2018 | Choi et al. |
| 9,935,258 B2 | 4/2018 | Chen et al. |
| 10,008,662 B2 | 6/2018 | You |
| 10,026,609 B2 | 7/2018 | Sreenivasan et al. |
| 10,038,137 B2 | 7/2018 | Chuang |
| 10,042,588 B2 | 8/2018 | Kang |
| 10,043,851 B1 | 8/2018 | Shen |
| 10,043,967 B2 | 8/2018 | Chen |
| 10,062,837 B2 | 8/2018 | Kim et al. |
| 10,115,446 B1 | 10/2018 | Louie et al. |
| 10,134,988 B2 | 11/2018 | Fennimore et al. |
| 10,163,479 B2 | 12/2018 | Berger et al. |
| 10,186,614 B2 | 1/2019 | Asami |
| 2002/0090533 A1 | 7/2002 | Zhang et al. |
| 2002/0105823 A1 | 8/2002 | Redon et al. |
| 2003/0085186 A1 | 5/2003 | Fujioka |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0026369 A1 | 2/2004 | Ying |
| 2004/0061154 A1 | 4/2004 | Huai et al. |
| 2004/0094785 A1 | 5/2004 | Zhu et al. |
| 2004/0130936 A1 | 7/2004 | Nguyen et al. |
| 2004/0173315 A1 | 9/2004 | Leung |
| 2004/0257717 A1 | 12/2004 | Sharma et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0018057 A1 | 1/2006 | Huai |
| 2006/0049472 A1 | 3/2006 | Diao et al. |
| 2006/0077734 A1 | 4/2006 | Fong |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2007/0019337 A1 | 1/2007 | Apalkov et al. |
| 2007/0096229 A1 | 5/2007 | Yoshikawa |
| 2007/0242501 A1 | 10/2007 | Hung et al. |
| 2008/0049488 A1 | 2/2008 | Rizzo |
| 2008/0079530 A1 | 4/2008 | Weidman et al. |
| 2008/0112094 A1 | 5/2008 | Kent et al. |
| 2008/0151614 A1 | 6/2008 | Guo |
| 2008/0259508 A2 | 10/2008 | Kent et al. |
| 2008/0297292 A1 | 12/2008 | Viala et al. |
| 2009/0046501 A1 | 2/2009 | Ranjan et al. |
| 2009/0072185 A1 | 3/2009 | Raksha et al. |
| 2009/0091037 A1 | 4/2009 | Assefa et al. |
| 2009/0098413 A1 | 4/2009 | Kanegae |
| 2009/0146231 A1 | 6/2009 | Kuper et al. |
| 2009/0161421 A1 | 6/2009 | Cho et al. |
| 2009/0209102 A1 | 8/2009 | Zhong et al. |
| 2009/0212997 A1* | 8/2009 | Michalski .............. G01S 7/285 342/137 |
| 2009/0231909 A1 | 9/2009 | Dieny et al. |
| 2010/0124091 A1 | 5/2010 | Cowburn |
| 2010/0162065 A1 | 6/2010 | Norman |
| 2010/0193891 A1 | 8/2010 | Wang et al. |
| 2010/0246254 A1 | 9/2010 | Prejbeanu et al. |
| 2010/0271870 A1 | 10/2010 | Zheng et al. |
| 2010/0290275 A1 | 11/2010 | Park et al. |
| 2011/0032645 A1 | 2/2011 | Noel et al. |
| 2011/0058412 A1 | 3/2011 | Zheng et al. |
| 2011/0061786 A1 | 3/2011 | Mason |
| 2011/0089511 A1 | 4/2011 | Keshtbod et al. |
| 2011/0133298 A1 | 6/2011 | Chen et al. |
| 2012/0052258 A1 | 3/2012 | Op DeBeeck et al. |
| 2012/0069649 A1 | 3/2012 | Ranjan et al. |
| 2012/0155156 A1 | 6/2012 | Watts |
| 2012/0155158 A1 | 6/2012 | Higo |
| 2012/0280336 A1 | 6/2012 | Watts |
| 2012/0181642 A1 | 7/2012 | Prejbeanu et al. |
| 2012/0188818 A1 | 7/2012 | Ranjan et al. |
| 2012/0280339 A1 | 11/2012 | Zhang et al. |
| 2012/0294078 A1 | 11/2012 | Kent et al. |
| 2012/0299133 A1 | 11/2012 | Son et al. |
| 2013/0001506 A1 | 1/2013 | Sato et al. |
| 2013/0001652 A1 | 1/2013 | Koshikawa et al. |
| 2013/0021841 A1 | 1/2013 | Zhou et al. |
| 2013/0244344 A1 | 9/2013 | Malmhall et al. |
| 2013/0267042 A1 | 10/2013 | Satoh et al. |
| 2013/0270661 A1 | 10/2013 | Yi et al. |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0042571 A1 | 2/2014 | Gan et al. |
| 2014/0070341 A1 | 3/2014 | Beach et al. |
| 2014/0103472 A1 | 4/2014 | Kent et al. |
| 2014/0136870 A1 | 5/2014 | Breternitz et al. |
| 2014/0151837 A1 | 6/2014 | Ryu |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0252439 A1 | 9/2014 | Guo |
| 2014/0264671 A1 | 9/2014 | Chepulskyy et al. |
| 2014/0281284 A1 | 9/2014 | Block et al. |
| 2015/0056368 A1 | 2/2015 | Wang et al. |
| 2015/0279904 A1 | 10/2015 | Pinarbasi et al. |
| 2016/0087193 A1 | 3/2016 | Pinarbasi et al. |
| 2016/0163973 A1 | 6/2016 | Pinarbasi |
| 2016/0218278 A1 | 7/2016 | Pinarbasi et al. |
| 2016/0283385 A1 | 9/2016 | Boyd et al. |
| 2016/0315118 A1 | 10/2016 | Kardasz et al. |
| 2016/0378592 A1 | 12/2016 | Ikegami et al. |
| 2017/0062712 A1 | 3/2017 | Choi et al. |
| 2017/0123991 A1 | 5/2017 | Sela et al. |

(56) References Cited

U.S. PATENT DOCUMENTS

| | | |
|---|---|---|
| 2017/0133104 A1 | 5/2017 | Darbari et al. |
| 2017/0199459 A1 | 7/2017 | Ryu et al. |
| 2018/0033957 A1 | 2/2018 | Zhang |
| 2018/0097006 A1 | 4/2018 | Kim et al. |
| 2018/0114589 A1 | 4/2018 | El-Baraji et al. |
| 2018/0119278 A1 | 5/2018 | Kornmeyer |
| 2018/0121117 A1 | 5/2018 | Berger et al. |
| 2018/0121355 A1 | 5/2018 | Berger et al. |
| 2018/0121361 A1 | 5/2018 | Berger et al. |
| 2018/0122446 A1 | 5/2018 | Berger et al. |
| 2018/0122447 A1 | 5/2018 | Berger et al. |
| 2018/0122448 A1 | 5/2018 | Berger et al. |
| 2018/0122449 A1 | 5/2018 | Berger et al. |
| 2018/0122450 A1 | 5/2018 | Berger et al. |
| 2018/0130945 A1 | 5/2018 | Choi et al. |
| 2018/0211821 A1 | 7/2018 | Kogler |
| 2018/0233362 A1 | 8/2018 | Glodde |
| 2018/0233363 A1 | 8/2018 | Glodde |
| 2018/0248110 A1 | 8/2018 | Kardasz et al. |
| 2018/0248113 A1 | 8/2018 | Pinarbasi et al. |
| 2018/0331279 A1 | 11/2018 | Shen |
| 2019/0259810 A1* | 8/2019 | Jacob ................ H01L 43/02 |

FOREIGN PATENT DOCUMENTS

| | | |
|---|---|---|
| EP | 1345277 | 9/2003 |
| FR | 2817998 | 6/2002 |
| FR | 2832542 | 5/2003 |
| FR | 2910716 | 6/2008 |
| JP | H10-004012 | 1/1998 |
| JP | H11-120758 | 4/1999 |
| JP | H11-352867 | 12/1999 |
| JP | 2001-195878 | 7/2001 |
| JP | 2002-261352 | 9/2002 |
| JP | 2002-357489 | 12/2002 |
| JP | 2003-318461 | 11/2003 |
| JP | 2005-044848 | 2/2005 |
| JP | 2005-150482 | 6/2005 |
| JP | 2005-535111 | 11/2005 |
| JP | 2006128579 | 5/2006 |
| JP | 2008-524830 | 7/2008 |
| JP | 2009-027177 | 2/2009 |
| JP | 2013-012546 | 1/2013 |
| JP | 2014-039061 | 2/2014 |
| JP | 5635666 | 12/2014 |
| JP | 2015-002352 | 1/2015 |
| KR | 10-2014-015246 | 9/2014 |
| WO | 2009-080636 | 7/2009 |
| WO | 2011-005484 | 1/2011 |
| WO | 2014-062681 | 4/2014 |

OTHER PUBLICATIONS

US 2016/0218273, Jul. 2016, Heiba et al. (withdrawn).

Bhatti Sabpreet et al., "Spintronics Based Random Access Memory: a Review," Material Today, Nov. 2107, pp. 530-548, vol. 20, No. 9, Elsevier.

Helia Naeimi, et al., "STTRAM Scaling and Retention Failure," Intel Technology Journal, vol. 17, Issue 1, 2013, pp. 54-75 (22 pages).

S. Ikeda, et al., "A Perpendicular-Anisotropy CoFeB—MgO Magnetic Tunnel Junction", Nature Mterials, vol. 9, Sep. 2010, pp. 721-724 (4 pages).

R.H. Kock, et al., "Thermally Assisted Magnetization Reversal in Submicron-Sized Magnetic Thin Films", Physical Review Letters, The American Physical Society, vol. 84, No, 23, Jun. 5, 2000, pp. 5419-5422 (4 pages).

K.J. Lee, et al., "Analytical Investigation of Spin-Transfer Dynamics Using Perpendicular-to-Plane Polarizer", Applied Physics Letters, American Insitute of Physics, vol. 86, (2005), pp. 022505-1 to 022505-3 (3 pages).

Kirsten Martens, et al., "Thermally Induced Magnetic Switching in Thin Ferromagnetic Annuli", NSF grants PHY-0351964 (DLS), 2005, 11 pages.

Kristen Martens, et al., "Magnetic Reversal in Nanoscropic Ferromagnetic Rings", NSF grants PHY-0351964 (DLS) 2006, 23 pages.

"Magnetic Technology Spintronics, Media and Interface", Data Storage Institute, R&D Highlights, Sep. 2010, 3 pages.

Daniel Scott Matic, "A Magnetic Tunnel Junction Compact Model for STT-RAM and MeRAM", Master Thesis University of California, Los Angeles, 2013, pp. 43.

* cited by examiner

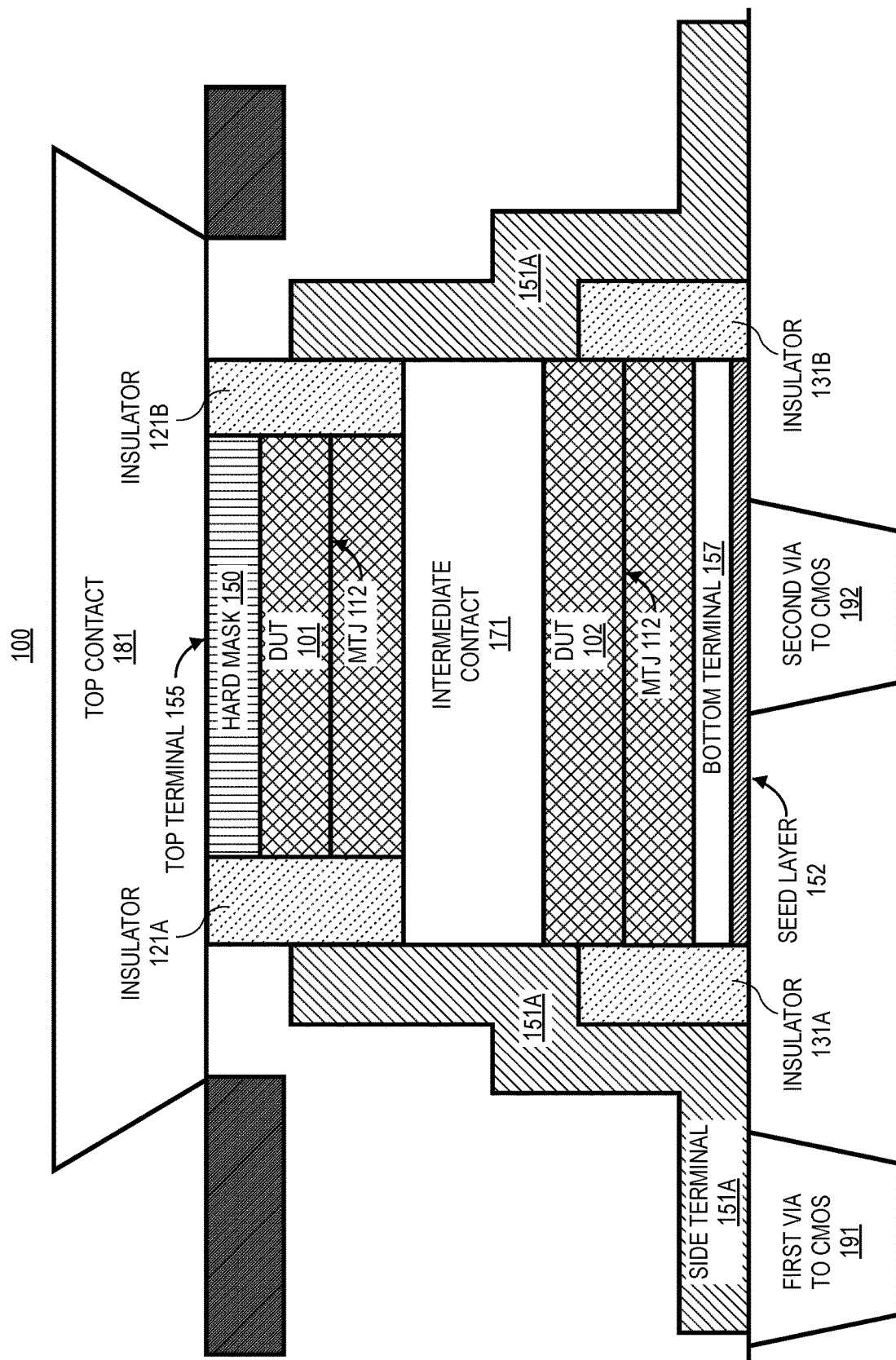

MULTI TERMINAL DEVICE STACK SYSTEMS AND METHODS

FIELD OF THE INVENTION

The present invention relates to the field of semi-conductor structure fabrication.

BACKGROUND

Electronic systems and devices have made a significant contribution towards the advancement of modern society and have facilitated increased productivity and reduced costs in analyzing and communicating information in a variety of business, science, education, and entertainment applications. Ever greater desire and market pressure for more capabilities in smaller devices creates a demand for increased component densities. However, as a practical matter there a number of issues (e.g., fabrication considerations, photolithograph capabilities, electrical interference between components, etc.) that limit conventional device component configurations giving rise to constraints on density and functionality.

Many conventional semi-conductor devices are arranged in two dimensional arrays over a portion of a semi-conductor die surface. The two dimensional arrays typically limit the number of devices fabricated in a given area of the semi-conductor die. Traditional attempts at three dimension device arrangements are usually complicated and problematic. One problem often encountered with traditional attempts at three dimension device arrangements is conventional stacks are typically limited to two terminals. A two terminal limitation means independent device operations and functionality in traditional stack configurations is typically non existent or significantly restricted. Conventional attempts at three or more independent terminal devices are typically limited to non-stacked devices in two dimensional arrays. Conventional attempts at three or more terminal devices also typically involve additional or extra separate steps of conventional overlay mask etching lithography.

SUMMARY

Embodiments of the present invention include multiple independent terminals for a plurality of devices in a stack configuration within a semiconductor. In one embodiment, a semiconductor comprises: a first device at a first semiconductor level within a multi terminal device stack; wherein the first device is coupled to a first terminal; a second device at a second semiconductor level within the multi terminal device stack, wherein the second device is coupled to a second terminal; and a third terminal is coupled to the first device, wherein the first terminal and second terminal are independently coupled to the first device and second device respectively. The third terminal can be coupled to the second device. The first terminal, the second terminal, and third terminal can couple components included in the multi terminal stack to components not included in the multi terminal stack. The components in the stack can be otherwise electrically isolated from the components not in the stack. The first terminal can be located on a first side location of the multi terminal stack and the second terminal is located on a second side location of the multi terminal stack. The third terminal is located on a third side location of the multi terminal stack.

In one embodiment, the first device is stacked above the second device within the multi terminal stack. The first device and second device can be active devices. In one exemplary implementation, an intermediate contact layer in the multi terminal stack is coupled to the first device and second device, and the intermediate contact layer is coupled to the third terminal. The first device and second device can be various types of devices (e.g., MTJs, heterojunction bipolar transistors, etc.).

In one embodiment, there is a fourth terminal. The fourth terminal can be located on a fourth side location of the multi terminal stack. The fourth terminal can be coupled to a device in the stack (e.g., the first device, the second device, etc.). The third terminal and fourth terminal can be coupled to an intermediate contact layer in the multi terminal stack, wherein the intermediate contact layer is coupled to the first device and second device, wherein the third terminal, the intermediate contact layer, and the fourth terminal form a contiguous contact. In one exemplary implementation, the third terminal and fourth terminal jointly supply more combined current to the stack than either terminal individually.

In one embodiment, a storage component comprises: a first magnetic tunnel junction (MTJ) device at a first semiconductor level within a multi terminal pillar; wherein the first MTJ device is coupled to a first terminal; a second MTJ device at a second semiconductor level within the multi terminal pillar, wherein the second MTJ device is coupled to a second terminal; and a third terminal is coupled to the first MTJ device and the second MTJ device. The first terminal and second terminal can be independently coupled to the first MTJ device and second MTJ device respectively. The first terminal can be coupled to the first side of the multi terminal pillar, the second terminal is coupled to a second side of the multi terminal pillar, and the third terminal is coupled on a third side of the multi terminal pillar. The first side can be a top side and the second side can be a bottom side. In one exemplary implementation, the first MTJ device is operable to store a first logical bit of information and the second MTJ device is operable to store a second logical bit of information, wherein the respective states of the first MTJ device and the second MTJ device convey the logical state of respective bit of information.

In one embodiment, the semiconductor further comprises a fourth terminal. The third terminal, intermediate contact layer, and fourth terminal can form a contiguous contact and can be coupled to multiple transistors operable to supply current to switch a state of the first MTJ device and second MTJ device. The multi terminal pillar can be less than or equal to 100 nanometers from another multi terminal pillar. The angle between a sidewall of the multi terminal pillar and a line from the base of the multi terminal pillar at to the top of another multi terminal pillar can be less than 50 degrees.

DESCRIPTION OF THE DRAWINGS

The accompanying drawings, which are incorporated in and form a part of this specification, are included for exemplary illustration of the principles of the present invention and not intended to limit the present invention to the particular implementations illustrated therein. The drawings are not to scale unless otherwise specifically indicated.

FIG. 1B is a block diagram of an exemplary multi terminal stack in accordance with one embodiment.

DETAILED DESCRIPTION

Figure 1A:
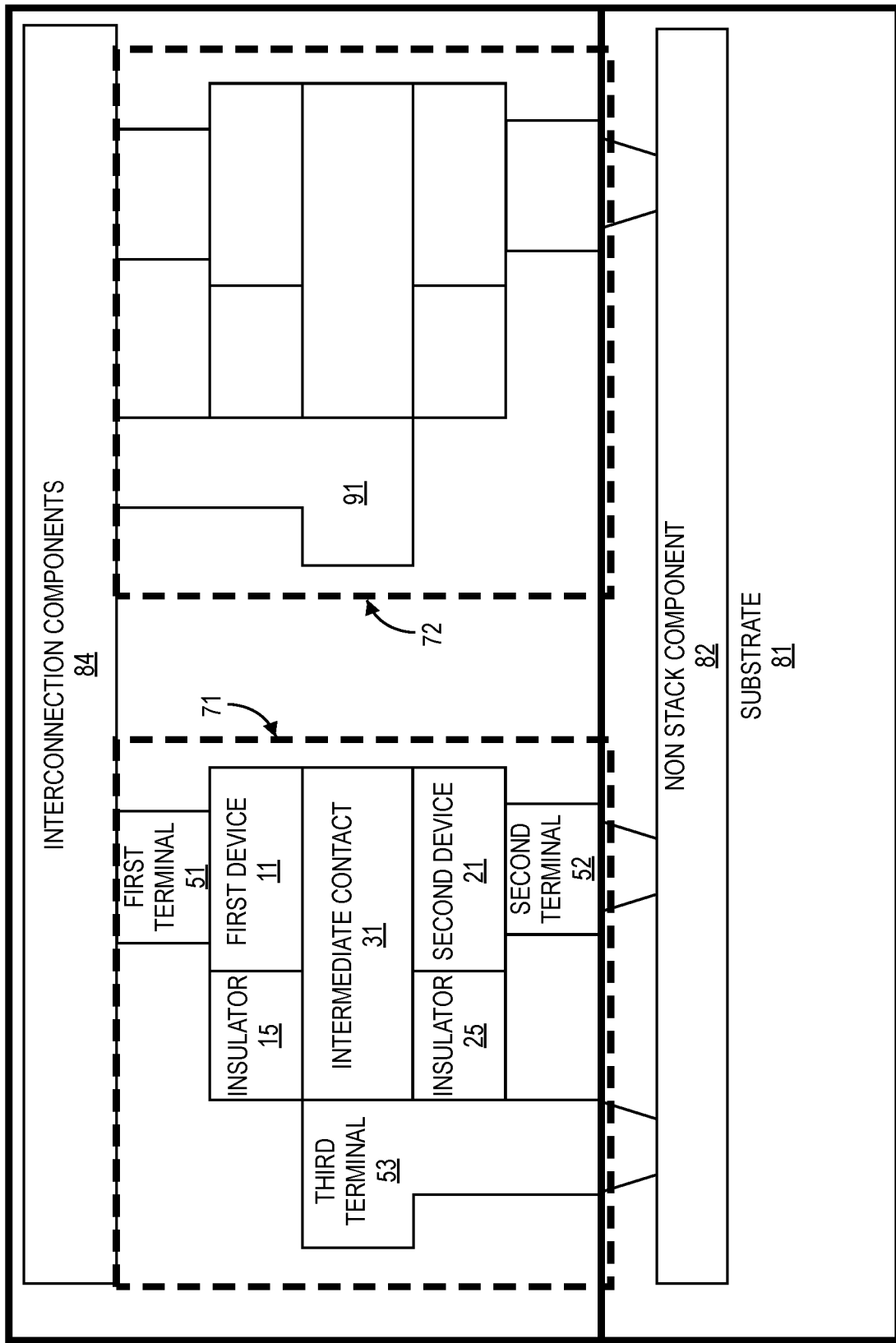
FIG. 1A is a block diagram of a portion of an exemplary semi-conductor in accordance with one embodiment.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Embodiments of the present invention facilitate convenient and efficient multiple terminal device fabrication. In one embodiment, a semi-conductor die includes a multi terminal three dimensional (3D) stacked device arrangement or configuration. A device included in a multi terminal 3D stacked device configuration can be stacked above or below another device included in the multi terminal 3D stacked device configuration. The terminals can be interconnection contacts utilized to couple components included in the multi terminal device stack to components not included in the multi terminal device stack. A terminal in a multi terminal stack can be a common or shared contact that is coupled to a first device in the stack and coupled to second device in the stack. A terminal in a multi terminal stack can be an independent contact that is coupled to a first device in the stack and not coupled to second device in the stack. In one embodiment, an independent terminal or contact enables independent operation of the first device from the second device.

It is appreciated a multi terminal device stack can have a variety of configurations. A multi terminal 3D stacked device configuration can include a terminal or interconnection contact that is common to multiple devices in a stack. In one embodiment, a device is electrically coupled to an independent terminal and electrically coupled to a common terminal. In one exemplary implementation, a device coupled to an independent terminal and a common terminal can perform independent operations or functions.

In one embodiment, a multi terminal stack includes a side terminal. A side terminal can be configured to electrically couple with components above or below the stack (e.g., components in a substrate, transistors not in the stack, interconnection metal layer above the stack, etc.). A side terminal can be configured to electrically couple with other components in a stack. In one embodiment, a multi terminal stack includes an intermediate contact that is electrically coupled to a terminal. The intermediate contact can be configured to electrically couple to a component in the stack. An intermediate contact can be coupled to a device and a side terminal forming a contiguous contact between the device and the side terminal. In one exemplary implementation, the intermediate contact is coupled to a single device in the stack. In one exemplary implementation, an intermediate contact is coupled to multiple devices in the stack. A multi terminal device stack can have two or more devices, two or more terminals, and so on.

In one embodiment, a component within the stack is self aligned. In one embodiment, a first device and a second device include respective side wall insulators configured to operate as insulators and masks. The side wall insulators can electrically insulate a portion of a component sidewall. The insulator can be configured as self aligned lithography masks. In one exemplary implementation, a multi terminal stack can include components (e.g., insulators, contacts, etc.) that are self aligned and components that are not self aligned. In one embodiment, the respective side wall insulators can encapsulate the respective sidewalls of the devices.

FIG. 1A is a block diagram of a portion of an exemplary semi-conductor in accordance with one embodiment. The semi conductor includes a multi terminal stack 71, a multi terminal stack 72, non-stack components 82 included in substrate 81, and interconnection components 84. Multi terminal stack 71 includes first device 11, second device 21, intermediate contact 31, a first terminal 51, a second terminal 52, a third terminal 53, and insulators 15 and 25. Insulator portion 15 electrically insulates a portion of first device 11 and insulator portion 25 electrically insulates a portion of second device 21. In one exemplary implementation, insulator portion 15 and can also operate as a mask to protect a portion of first device 11 from material removal (e.g., etching, polishing, etc.). Similarly, insulator portion 25 and can also operate as a mask to protect a portion of first device 21 from material removal (e.g., etching, polishing, etc.). Insulators 15 and 25 can be self aligned.

In one embodiment, the first terminal, second terminal, and third terminal can be interconnection terminals or contacts configured to electrically couple components included in the stack to components not included in the stack. In one exemplary implementation, the components in the stack are otherwise electrically isolated from the components not in the stack. In one embodiment, the first terminal 51 is a top terminal, second terminal 52 is a bottom terminal, and third terminal 53 is a side terminal. First terminal 51 can electrically couple first device 11 to interconnection components 84. Interconnection components 84 can electrically couple components, including coupling components in a stack to other components not in the stack. Interconnection components 84 can include metal interconnection layers, interconnection vias, external contacts, and so on. Interconnection components 84 can electrically couple first terminal 51 and first device 11 to other components (e.g., components in multi terminal stack 72, other components in the semiconductor (not shown), components external to the semiconductor (not shown), etc.). Second terminal 52 can electrically couple second device 21 to a non stack component in non stack components 82. Non stack component 82 can include various different components (e.g., switches, transistors, resistors, optical components, etc.). Third terminal 53 can electrically couple intermediate contact 31, first device 11, and second device 21 to a component in non stack components 82. In one embodiment, a terminal or interconnection contact is a no or very low ohmic coupling from one element or component to another element or component.

In one embodiment, first terminal 51 and second terminal 52 can be surface contacts of first device 51 and second device 52. In one exemplary implementation, a surface contact of a device 52 does not extend below into the substrate, but rather is coupled to a via that extends down into the substrate and coupled to non stack components 82.

In one embodiment, components in a first stack can be coupled to components in another stack via interconnection components 84, non stack components 82, and so on. In one embodiment, a multi terminal stack 72 includes components similar to multi terminal stack 71. In one exemplary implementation, a third terminal 91 in multi terminal stack 72 is coupled to a component in interconnection components 84 through via 92.

A multi terminal 3D stacked device arrangement or configuration can include devices arranged in a pillar configuration and the pillar can have multiple terminals. It is appreciated a multi terminal stack or pillar can include a variety of devices (e.g., a magnetic tunnel junction device (MTJ), a heterojunction bipolar transistors, active devices, passive devices, etc.).

First device 11 and second device 21 can be storage devices. The storage devices can be magnetic storage or memory devices. Magnetic memory devices typically store information by adjusting and holding magnetic fields within components of the device. Stored information (e.g., bits, logical ones and zeros, true/false indications, etc.) corresponds to a state of the magnetic fields and resulting electrically resistive characteristics. A memory cell that includes a magnetic tunnel junction (MTJ) is one type of magnetic memory structure. A MTJ typically includes ferromagnetic portions separated by a non-magnetic material. The magnetic orientation or spin of a ferromagnetic portion can be altered and results in a change to the electrical resistive characteristics of the device. The change in resistive characteristics can have different impacts on an electric current passing through the structure. The state or characteristics of the current are associated with indications of the stored information. In one embodiment, the first device and second device are independently addressable MTJ devices configured in a 3D stack configuration. In one exemplary implementation, the MTJ devices are included in a multi-leveled logic magnetic random access memory (MRAM).

In one embodiment, a MTJ included in the multi terminal pillar can form a portion of a memory cell. In one exemplary implementation, a MTJ can be used to form a multi-logic level or multiple bit memory device. It is appreciated overlapping MTJs can be included in a variety of devices. In one embodiment, an MTJ is included in a magnetoresistive random-access memory (MRAM). The MTJs can have various configurations. In one embodiment, the MTJs can be configured as pillar MTJs (pMTJs). The pMTJ can be considered a 3D MTJ structure. In one embodiment a multi terminal pillar includes two independently addressable MTJ devices configured in a stacked 3D configuration. In one exemplary implementation, a multi terminal pillar is included in a multi-leveled logic MRAM. The multi terminal pillar can include a 3-terminal heterostructrure device appropriate for MLC MRAM.

FIG. 1B is a block diagram of an exemplary multi terminal stack 100 in accordance with one embodiment. The view shown in FIG. 1B is a side cut out view through the multi terminal stack 100. Multi terminal stack 100 includes a first device DUT 101, a second DUT 102, intermediate contact 171, hard mask 150, seed layer 152, and insulators 121 (shown as 121A, 121B) 131 (shown as 131A, and 131B). In one embodiment, portions 121A and 121B wrap around the pillar to form a single insulator 121, and similarly portions 131A and 131B wrap around the pillar to form a single insulator 131. DUT 101 includes MTJ 111. DUT 102 includes MTJ 112. DUT 101 and DUT 102 are coupled to intermediate contact layer 171. The multi terminal stack 100 also includes a first terminal 155, second terminal 157, and a third terminal 151 (shown as 151A and 151B). First terminal 155 is a top terminal coupled to top contact 181, second terminal 157 is a bottom contact coupled to second via 192, and the third terminal 151 is a side terminal (e.g., comprising a terminal portion 151A and terminal portion 151B, etc.). In one embodiment, terminal portion 151A and terminal portion 151B includes a terminal sidewall portion or sidewall contact portion. The terminal sidewall portion can be substantially parallel to a sidewall of a multi terminal stack. Terminal portion 151A and terminal portion 151B can be part of a single terminal. In one exemplary implementation, a single sidewall terminal surrounds the sides of a stack and two parts or portions of the single sidewall terminal are shown as terminal portion 151A and terminal portion 151B. Terminal portion 151A and terminal portion 151B are coupled to intermediate contact layer 171. Terminal portion 151A is also coupled to first via 191. In another embodiment, portions 151A and 151B can be separated by insulators and form separate terminals.

The multi terminal stack 100 is also coupled to top contact 181 through top terminal 155, and multi terminal stack 100 is also coupled to bottom second via 192 through bottom terminal 157. In one embodiment, top terminal 155 is a surface of hard mask 150 and bottom terminal 157 is part of a surface of seed layer 152. In one exemplary implementation, top contact 181 is part of top terminal 155, and bottom second via 192 is part of bottom terminal 157. Top contact 181 and bottom second via 192 can be coupled to other components (not shown). In one exemplary implementation, first via 191 and second via 192 are respectively coupled to complimentary metal on silicon transistors (CMOSs) (not shown).

It is appreciated that a side terminal may be coupled to a side of a multi terminal stack and to other components not at the side of a multi terminal stack. A side terminal can be coupled to interconnection contacts located in a layer that is higher or above a multi terminal stack. A side terminal can be coupled to interconnection contacts located in a layer that is lower or below a multi terminal stack. The interconnection contacts can be coupled to various components (e.g., vias, metal layers, etc.) in semiconductor layers that are higher or lower than a multi terminal stack or pillar.

In one embodiment, a multi terminal stacked device configuration includes multiple terminals coupled to devices included in a stack configuration. The stack can be considered a multi terminal stack. A terminal can be coupled to a device in the stack independent of another device in the stack. In one embodiment, the first and second devices are configured to operate independently. In one exemplary implementation, the first terminal and second terminal are separate and independent enabling the first device to operate independently of the second device. In one exemplary implementation, the first and second devices are independently addressable information storage devices configured in a 3D stack configuration. In one embodiment, the first device and second devices include storage components that operate based upon electromagnetic principles. The first and second device can be MTJ devices. In one exemplary implementation, multi terminal stack 100 is a 3 dimensional stacked MLC MTJ.

It is appreciated various processes can be utilized to fabricate a multi terminal device stack. A self alignment fabrication process can be utilized. In one embodiment, a self alignment process can enable configuration of a component or region without a corresponding etch mask. A self alignment process can enable configuration of a component or region alignment based upon another component or region. In one embodiment, a self alignment mask enables a component of the device to act as an etch mask for a subsequent lithography process without the need for a separate overlay mask to perform the same masking operation as the self aligned mask. In one exemplary implementation, an insulating component of the device acts as a self alignment mask. A self aligned component can have the advantage that offset due to overlay uncertainty during lithographic patterning can be completely or substantially ignored. In one embodiment, both self aligned masks and overlay masks can be utilized in fabricating devices in a multi terminal stack configuration. Devices can be stacked and fabricated with separate deposition and lithography steps. In one embodiment, terminal sidewall portions are formed using self aligned mask processes and other contacts (e.g., a top contact, a bottom contact, etc.) to the device are formed with separate overlay mask lithography.

In one embodiment, a self alignment fabrication process is a mask-less self aligned process. The self alignment fabrication process can be a mask-less self aligned device isolation and passivation process. In one exemplary implementation, a STT device isolation process enables low ESD pillar formation facilitating high device density configurations. The self alignment fabrication process can include good sidewall thickness (e.g., thick enough to not breakdown while thin enough to enable device closeness or density, etc.) and angle control (e.g., control the angle between a sidewall of the multi terminal pillar and a line from the base of the multi terminal pillar at to the top of another multi terminal pillar, control the angle to 50 degrees or less, etc.). A relatively thin sidewall can result in narrower device spacing or pitch than a relatively thick sidewall.

In one embodiment, a self alignment fabrication process includes alternating etch processes with deposition processes to create insulation regions that can operate as an insulator and also self-aligned etch masks utilized in terminal formation. The terminal formation can include formation of an electrically conductive contact material on a sidewall of a device stack. An insulator can be configured with openings or gaps through which a sidewall terminal structure is coupled to another component in the stack. In one exemplary implementation, there is an intermediate or middle contact coupled to two devices included in the stack, and intermediate contact is also coupled to a side terminal structure forming a contiguous junction through an opening in a side insulator.

Figure 2A:
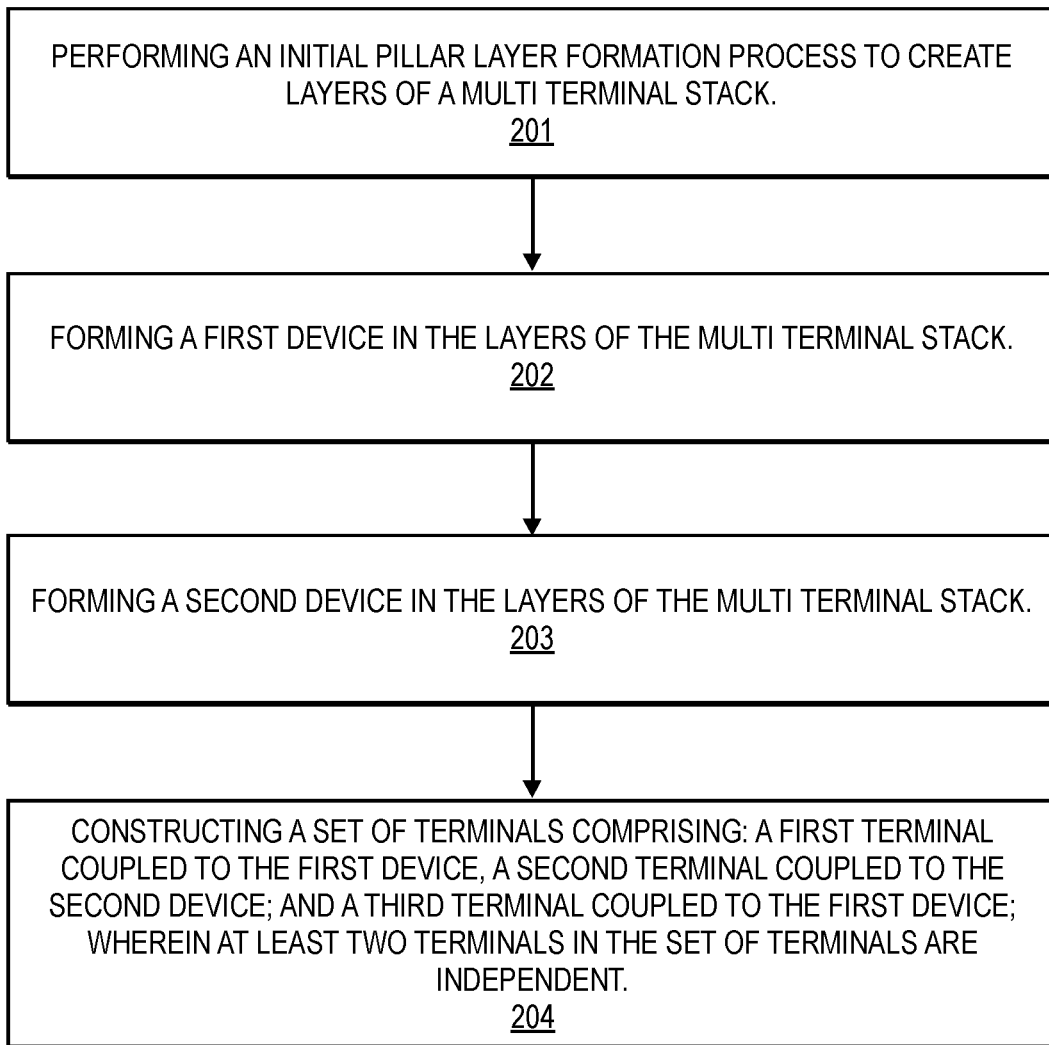
FIG. 2A is a block diagram of an exemplary multi terminal stacked device formation method in accordance with one embodiment.

FIG. 2A is a block diagram of an exemplary multi terminal stacked device formation method in accordance with one embodiment.

In block 201, an initial pillar layer formation process is performed to create layers of a multi terminal stack. In one embodiment, the initial pillar formation includes formation of a seed layer, multiple device layers, an intermediate contact layer, and a hard mask layer. The initial pillar layer formation process can include layers for multiple devices and layers for multiple intermediate contacts.

In block 202, a first device is formed in the layers of the multi terminal stack. In one embodiment, device formation includes creation of a sidewall insulator region that operates to electrically insulate a portion of the first device. The insulator can also operate as a sidewall mask that protects a portion of the first device sidewall during an etch process. In one embodiment, formation of the first device includes alternating etch process with deposition process to create self-aligned masks. It is appreciated a variety of devices can be formed in the layers of the multi terminal stack.

In block 203, a second device is formed in the layers of the multi terminal stack. In one embodiment, a portion of an intermediate contact layer can be coupled to the first device and second device. The first device and second device can be MTJs.

In block 204, a set of terminals is constructed. The set of terminal includes: a first terminal coupled to the first device, a second terminal coupled to the second device; and a third terminal coupled to the first device; wherein at least two terminals in the set of terminals are independent. In one embodiment, the third terminal is coupled to the second device. In one exemplary implementation selected components included in the multi terminal stack are configured to couple to external components through the first terminal, second terminal, and third terminal, wherein the selected components and other components included in the multi terminal stack are otherwise isolated from external components not included in the multi terminal stack. The first terminal, second terminal, and third terminal can be interconnection contacts configured to electrically couple components included in the stack to components not included in the stack, wherein the components in the stack are otherwise electrically isolated from the components not in the stack. The portion of the intermediate contact layer can be coupled to the third terminal.

Figure 2B:
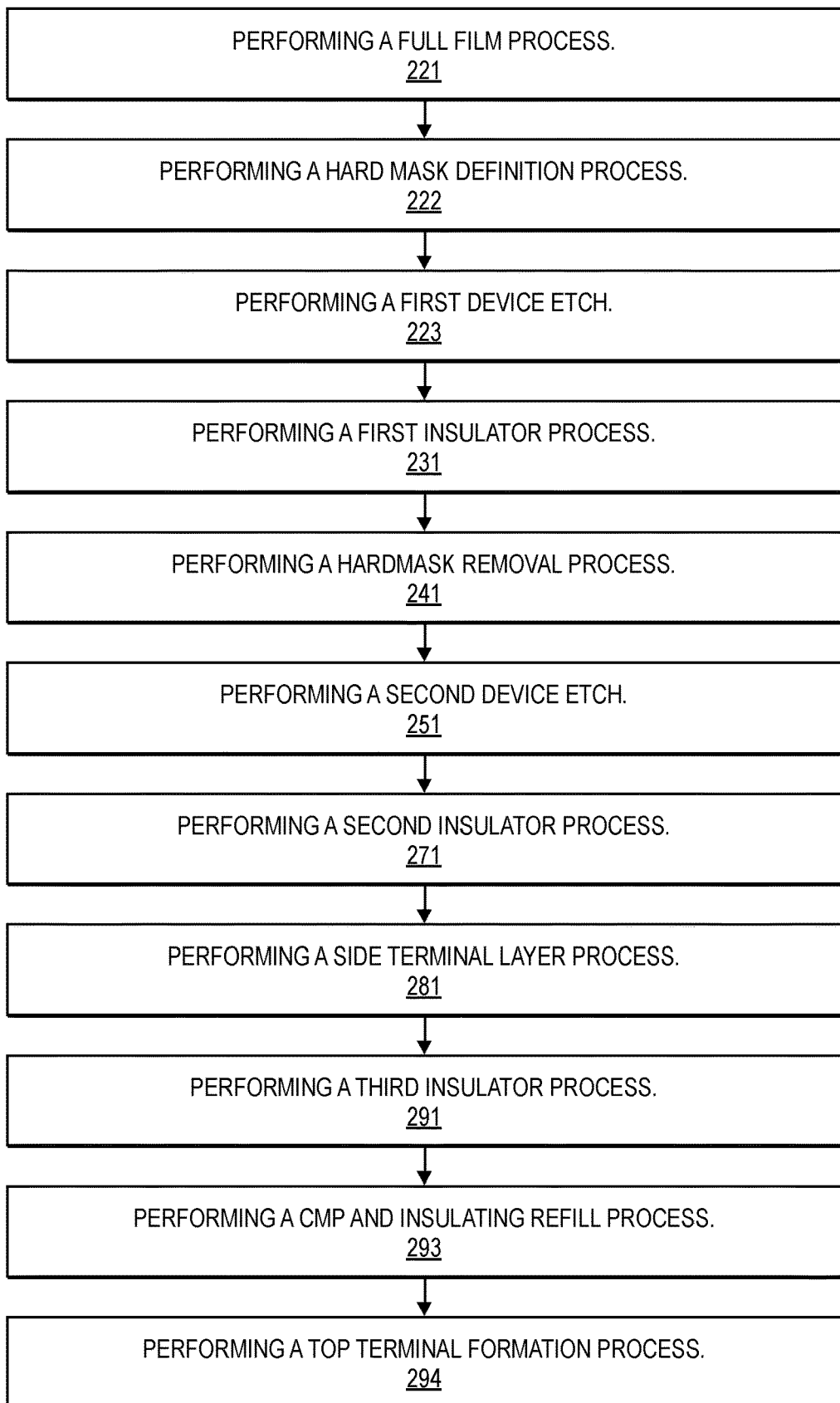
FIG. 2B is a block diagram of an exemplary multi terminal stacked device formation method in accordance with one embodiment.

In one embodiment, a fourth terminal is constructed. The third terminal and fourth terminal can be coupled to a portion of an intermediate contact layer in the multi terminal stack. The intermediate contact layer can be coupled to the first device, wherein the third terminal, the intermediate contact layer, and the fourth terminal form a contiguous contact. In one exemplary implementation, the first terminal is constructed on a first side of the multi terminal stack and the second terminal is constructed on a second side of the multi terminal stack, and the third terminal is constructed on a third side of the multi terminal stack. The first device can be stacked above the second device within the multi terminal stack FIG. 2B is a block diagram of an exemplary multi terminal stacked device formation method in accordance with one embodiment. The devices formed in multi terminal stacked device method 200 include MTJs. In one exemplary implementation, the multi terminal stacked devices are fabricated in a pillar configuration.

Figure 3A:
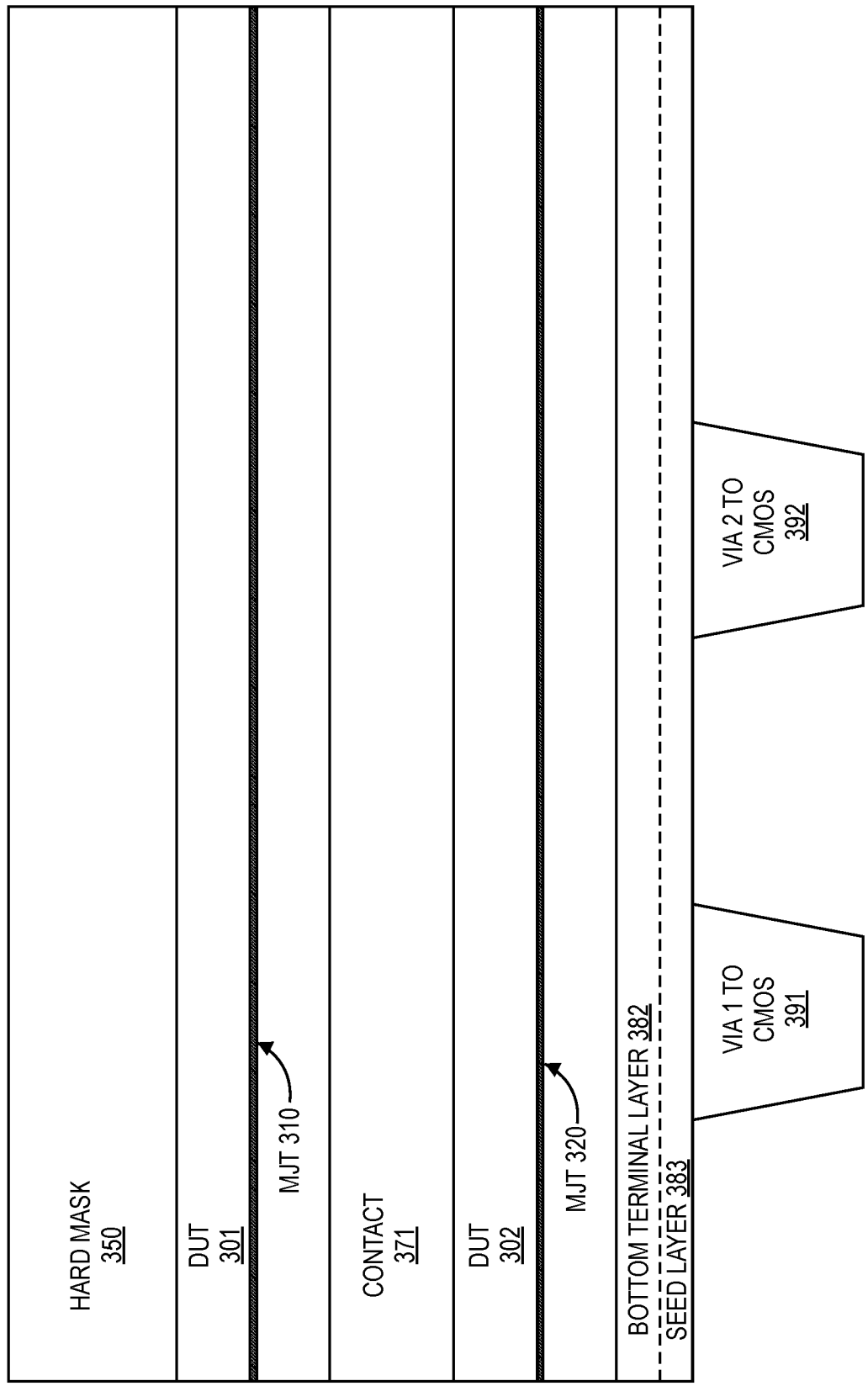
FIG. 3A is a block diagram of exemplary full film layers in accordance with one embodiment.

In block 221, a full film process is performed. In one embodiment, the full film process includes formation of bottom terminal layer (which can include a seed layer), multiple device layers, intermediate contact layer, and a hard mask layer. The full film process can include multiple devices and multiple intermediate contact layers. In one embodiment, layers in the full film process are deposited on a substrate using a thin film sputter deposition. FIG. 3A is a block diagram of exemplary full film layers in accordance with one embodiment. The full film layers include bottom terminal layer 382 with seed layer 383, device layer 302, intermediate contact layer 371, device layer 301, and hard mask layer 350. In one embodiment, seed layer 383 can be used to initiate a desired crystalline growth in the layers above the seed layer. The device layers 301 and 302 are stacked in a third dimensional axis of the pillar. It is appreciated the device layers can be associated with various different types of devices. Device layer 301 includes MTJ tunnel barrier 310 and device layer 302 includes MTJ tunnel barrier 320. In one embodiment, the tunnel barriers include magnesium oxide (MgO).

In one embodiment, a full film process is performed on top or other substrate components. The other components can include a via, a switch, a transistor, an interconnection layer, a metal layer, and so on. In one exemplary implementation, a full film process is performed on top of a via (e.g., via 391, via 392, etc.) that are coupled to complimentary metal oxide silicon (CMOS) transistors.

Figure 3B:
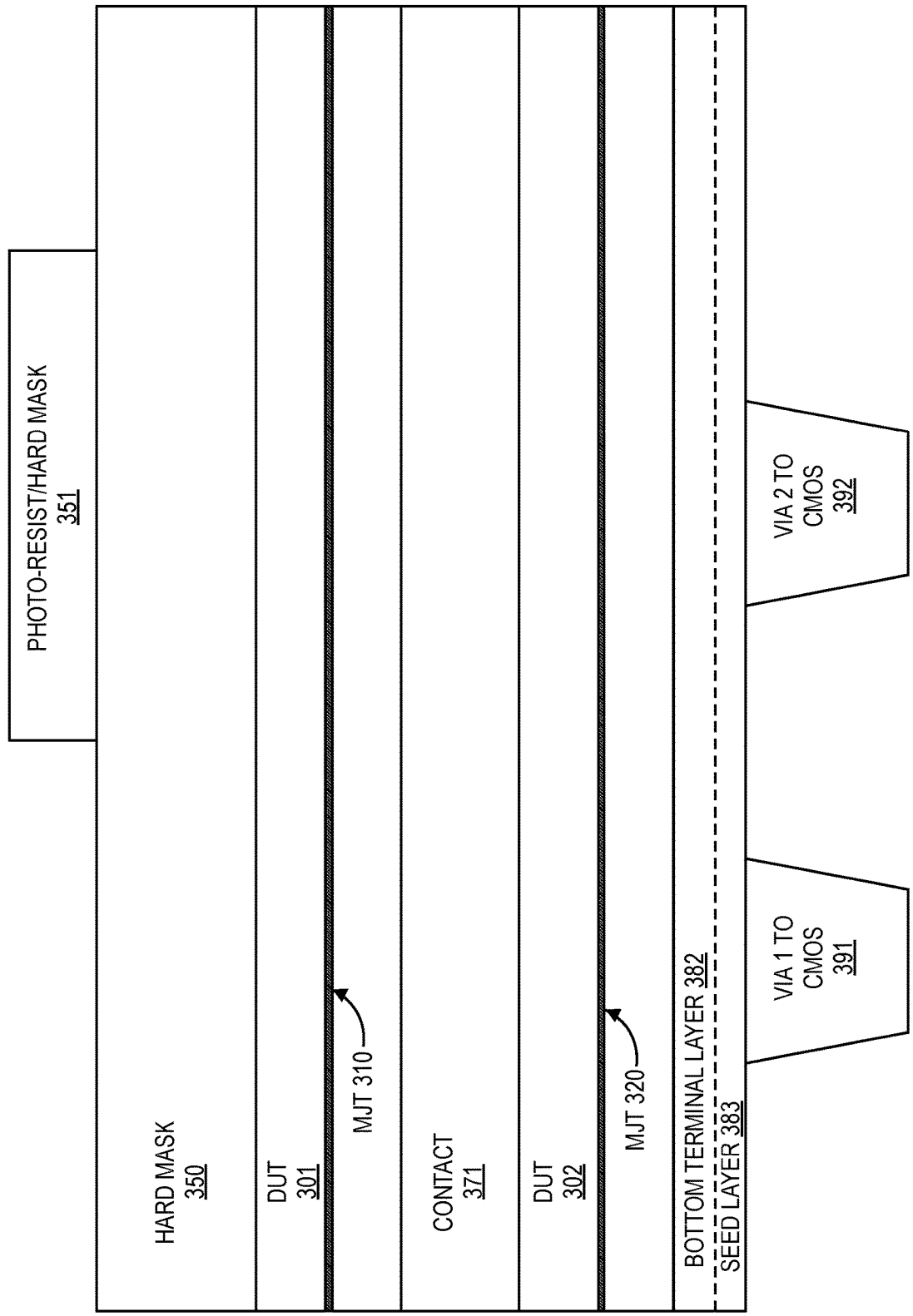
FIG. 3B is a block diagram of an exemplary lithography defined hard mask in accordance with one embodiment.
Figure 3C:
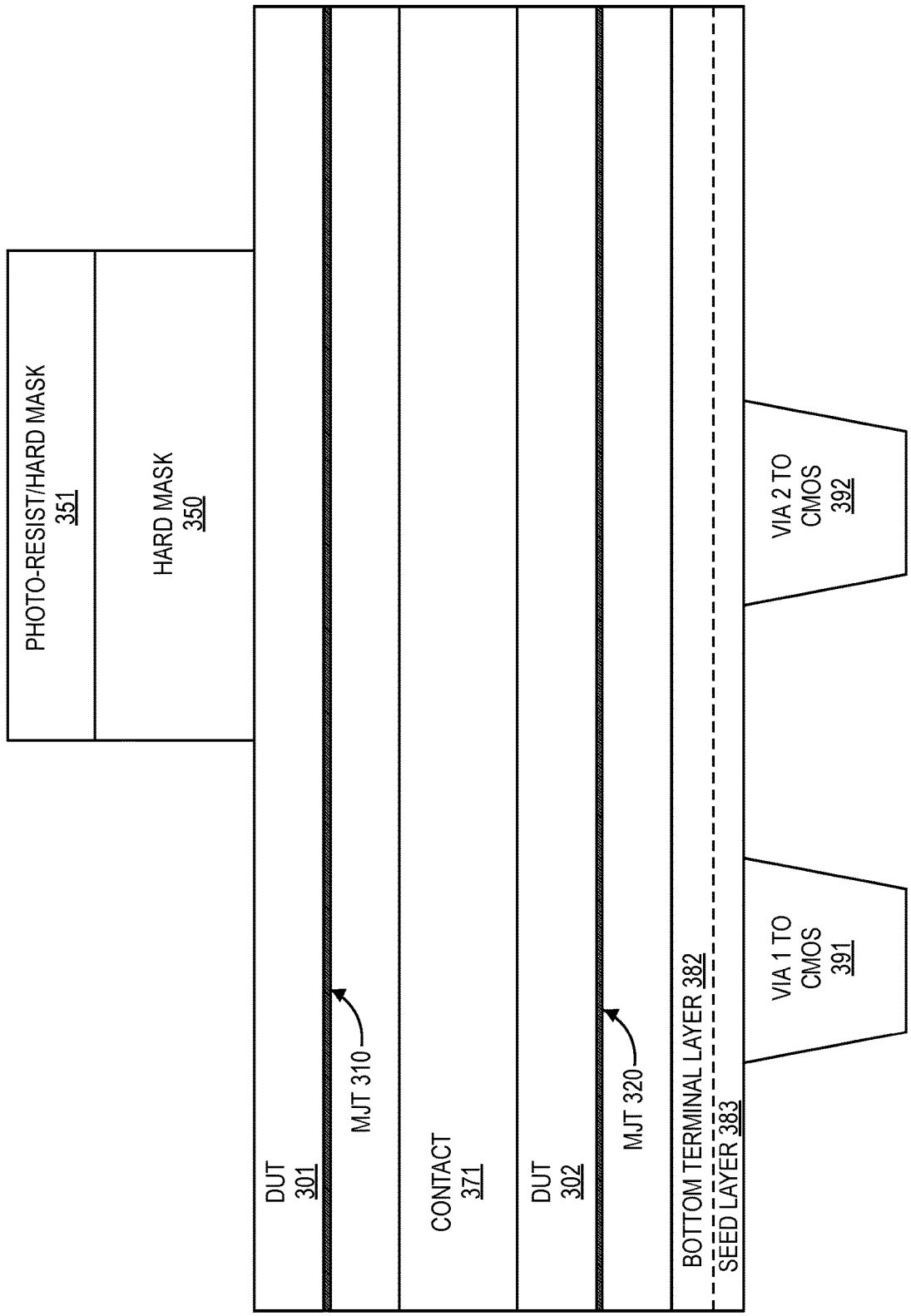
FIG. 3C is a block diagram of an exemplary hard mask etch in accordance with one embodiment.

In block 222, a hard mask definition process is performed. The hard mask can be utilized to define dimensions or configuration of a pillar. In one embodiment, hard mask definition process includes a lithography defined hard mask. In one exemplary implementation, multiple hard mask layers are utilized in the hard mask definition process. FIG. 3B is a block diagram of an exemplary of lithography defined photo resist or hard mask 351. The photo resist or hard mask 351 can be patterned or developed to roughly form the configuration of the stack or pillar from the perspective of a top view looking down. A hard mask definition process includes a hard mask etch. Various etching techniques can be used (e.g., ion milling, reactive ion etching, etc.) is utilized to etch the hard mask. FIG. 3C is a block diagram of an exemplary hard mask etch in accordance with one embodiment. The hard mask etch removes excess hard mask 350 from the pillar.

Figure 3D:
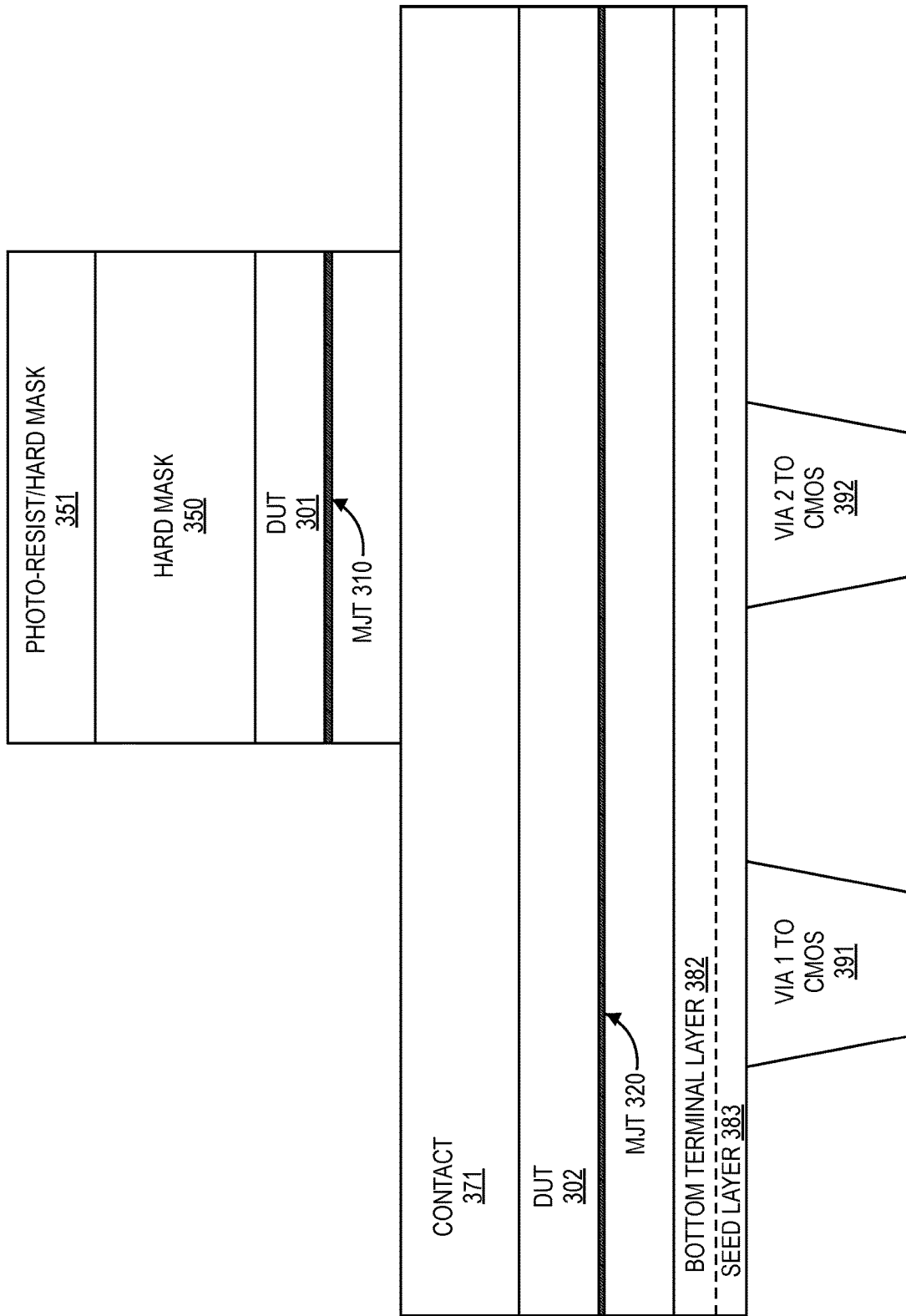
FIG. 3D is a block diagram of an exemplary first device etch in accordance with one embodiment.

In block 223, a first device etch process is performed. The first device etch process configures the sidewall of the first device. In one exemplary implementation, the first device etch is an ion beam etch (IBE). FIG. 3D is a block diagram of an exemplary first device etch in accordance with one embodiment. Portions of DUT 301 layer and MTJ layer 310 that are not protected by hard masks 351 and 350 are etched away, forming the first device area comprising DUT 301, including MTJ 310. Various types of etching can be used (e.g., a field etch, a reactive ion etch, inductively coupled plasma etcher, ion beam etch, chemical etch, etc.). In one embodiment, separate etching steps are implemented using alternating ion beam etching and reactive ion beam etching. The etch can be a self aligned etch. The etch can be an anisotropic etch.

Figure 3E:
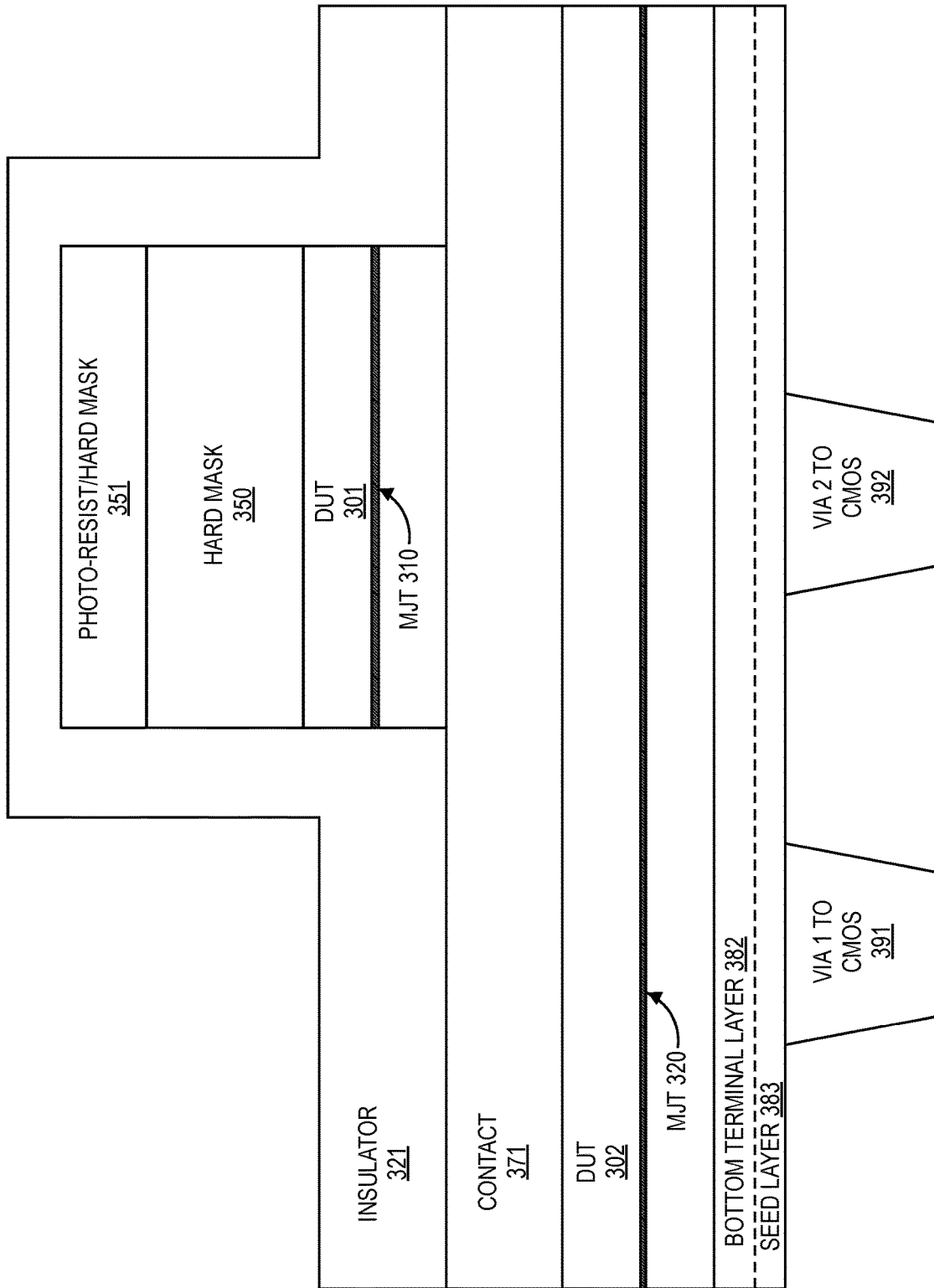
FIG. 3E is a block diagram of an exemplary first insulator deposition in accordance with one embodiment.

In block 231, a first insulator process is performed. A first insulator is deposited on the remaining potions of the full film and also to cover the sidewalls and top of the first device in an initial pillar structure formed in block 223. FIG. 3E is a block diagram of an exemplary first insulator deposition in accordance with one embodiment. Insulator 321 is deposited on top of the remaining full film intermediate contact layer 371, up against the sidewalls of the DUT 301 (including MTJ 310), up against the sidewalls of hard masks 350 and 351 and also on top of hard mask 351. The insulator can include various materials (e.g., silicon dioxide (SiO2), silicon nitride (SiN), etc.). The insulator can be conformally deposited using various techniques (e.g., atomic layer deposition (ALD), plasma enhanced chemical vapor deposition (PECVD), etc.). In one embodiment, the insulation has a thickness of 1 nanometer to 100 nanometers.

Figure 3F:
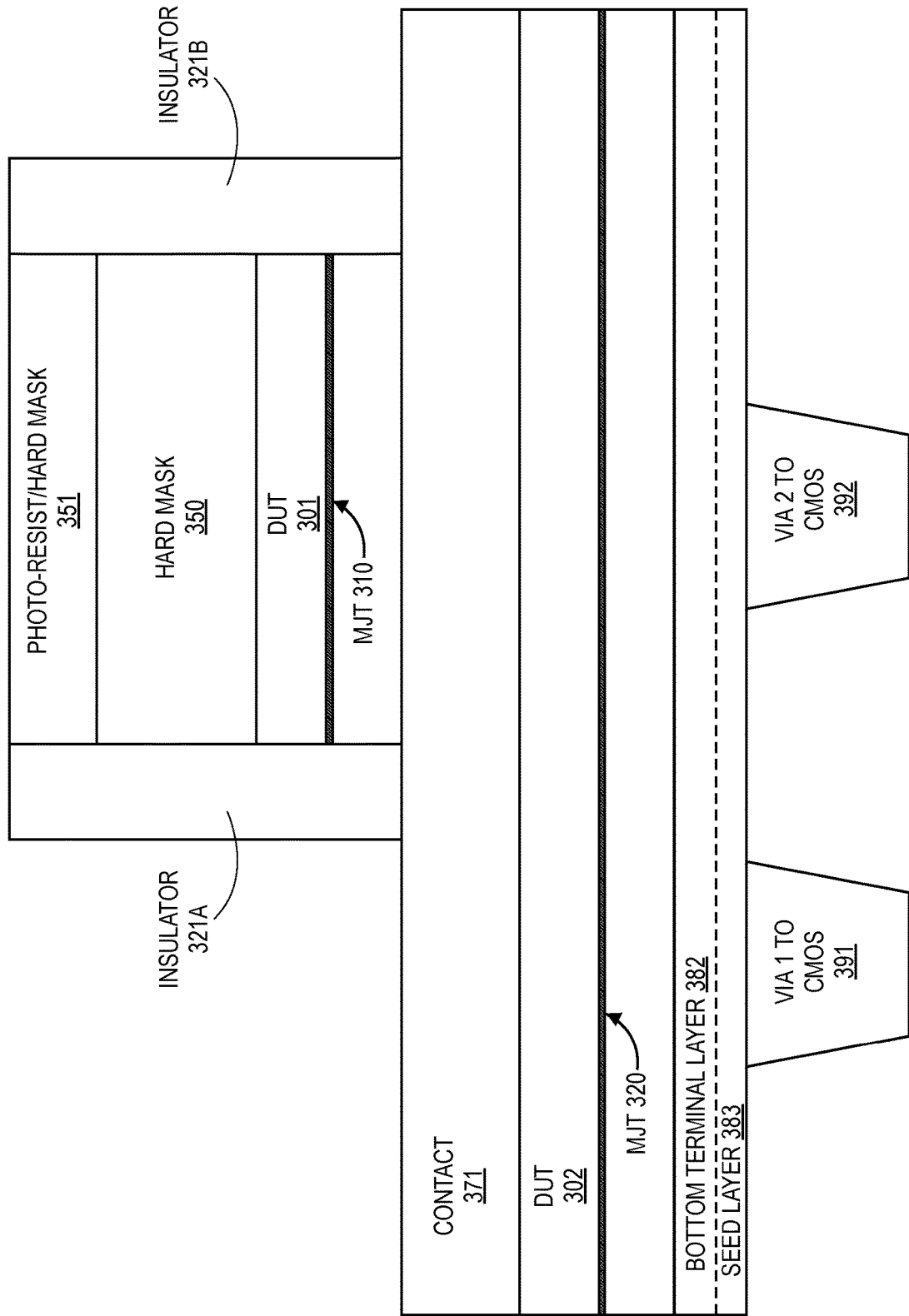
FIG. 3F is a block diagram of an exemplary first insulator etch in accordance with one embodiment.

As part of the first insulator process, the first insulator is subjected to an etch to form the sidewall insulation which also serves as a sidewall mask. Various types of etching can be used (e.g., a field etch, a reactive ion etch, inductively coupled plasma etcher, ion beam etch, chemical etch, etc.). The etch can be a self aligned etch. The etch can be an anisotropic etch. In one embodiment, the first insulator is substantially removed or etched from planar surfaces but remains on the sidewalls of the stack. FIG. 3F is a block diagram of an exemplary first insulator etch in accordance with one embodiment. Portions of insulator 321 not adjacent to the side walls of DUT 301 (including MTJ 310) and hard masks 350 and 351 is etched away. After the etch, insulting portions 321A and 321B remain on the sidewalls of hard mask 351 and DUT 301 (including the sidewalls of MTJ 310).

Figure 3G:
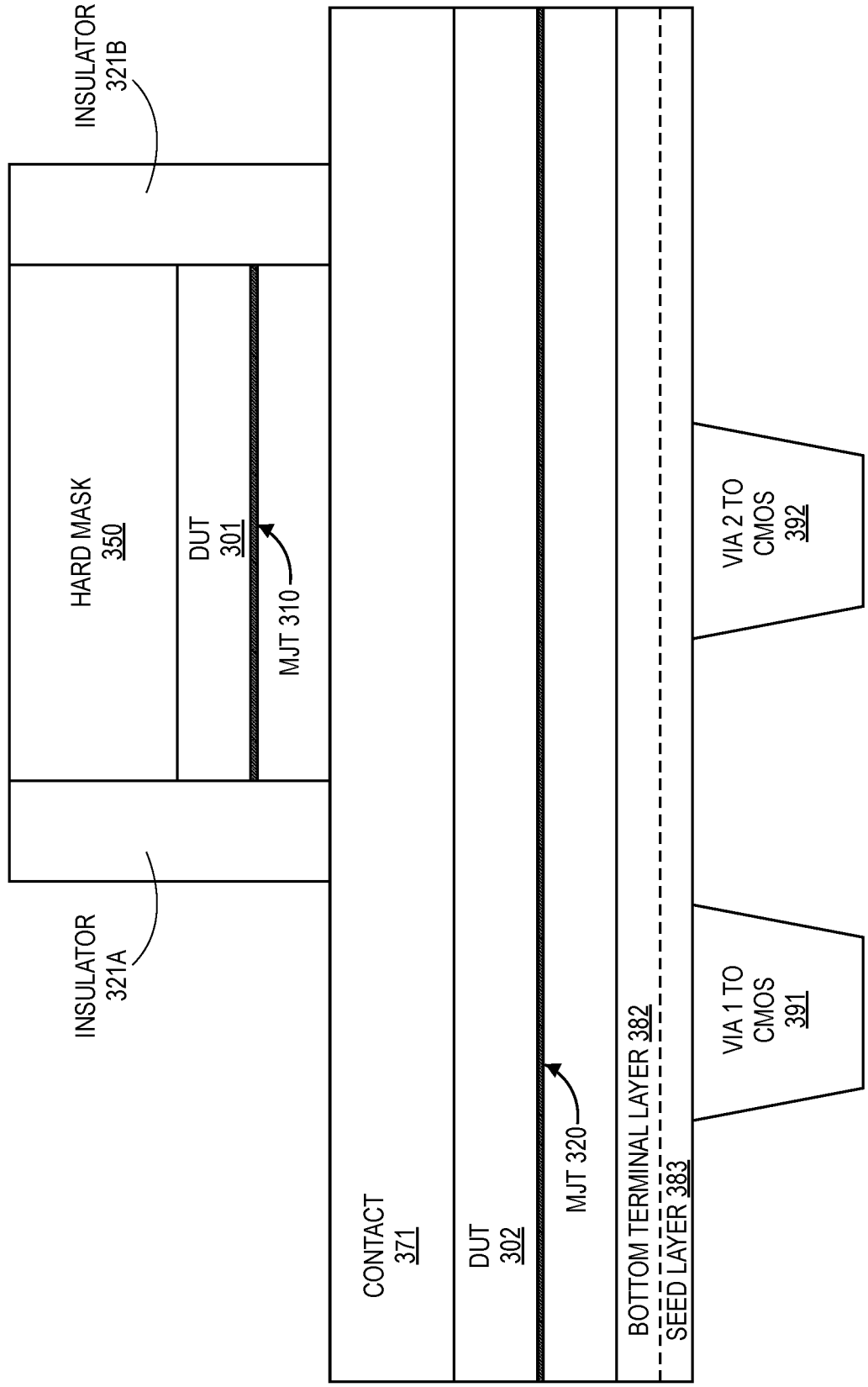
FIG. 3G is block diagram of an exemplary removal of a portion of the hard mask in accordance with one embodiment.

In block 241, a hard mask removal process is performed. In one embodiment, a portion of a hard mask above the first device is removed. The portion of first insulator on the sidewall of the portion of removed hard mask can also be removed. In one embodiment, a CMP process can be used to remove a portion of the hard mask from above the first device and corresponding insulator on the sidewall of the removed hard mask portion. FIG. 3G is block diagram of an exemplary removal of a portion of the hard mask in accordance with one embodiment. The hard mask 351 and corresponding part of first insulator portions 351A and B on the sidewalls are removed. After the etch, part of insulting portions 351A and 351B remain on the sidewalls of DUT 301 (including the sidewalls of MTJ 310).

Figure 3H:
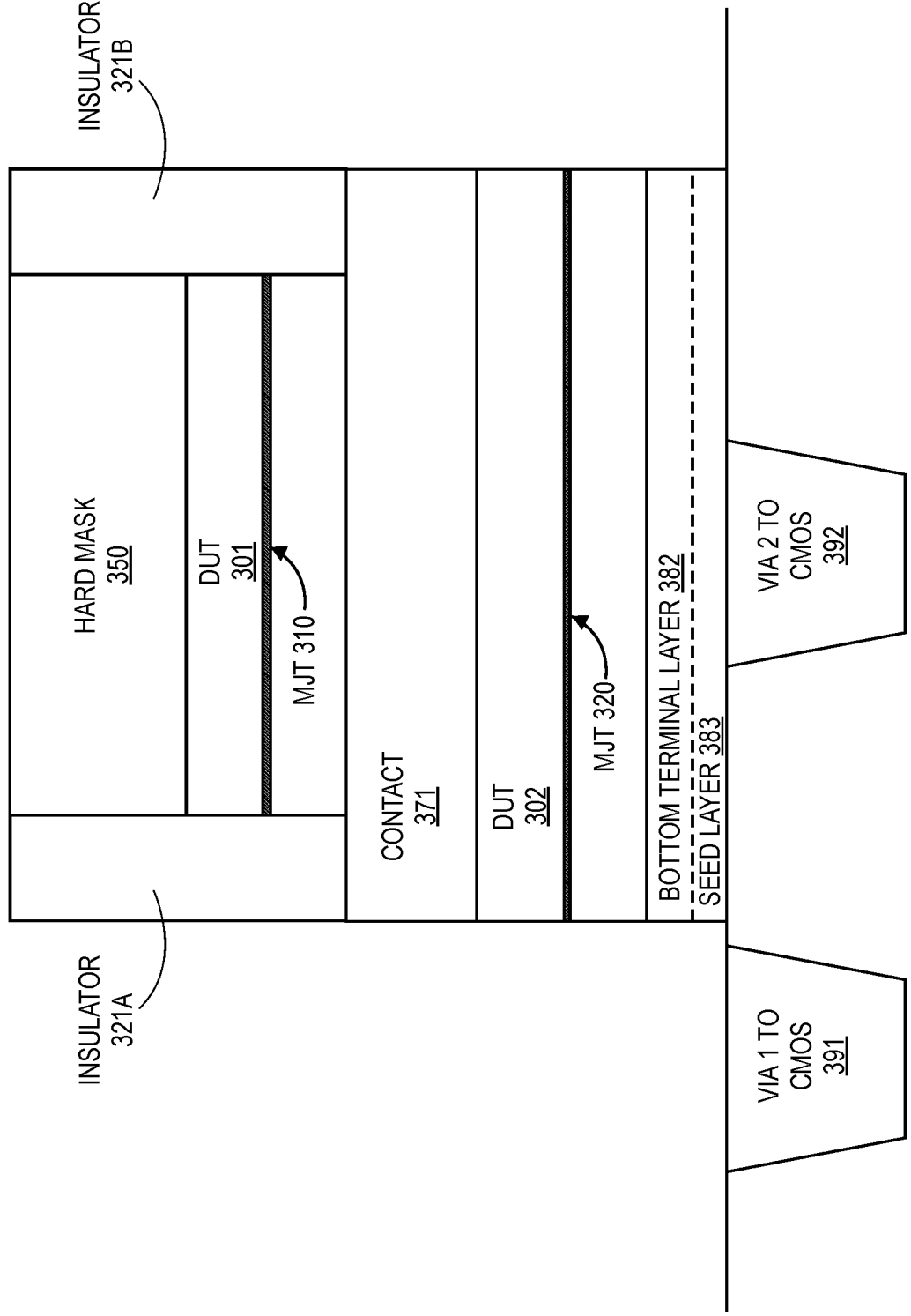
FIG. 3H is a block diagram of an exemplary second device etch process in accordance with one embodiment.

In block 251, a second device etch process is performed. In one embodiment, the portion of a first insulator remaining after block 231 can operate as a mask during the second device etch process. In one exemplary implementation, the first insulator remaining after block 231 can operate as a mask to protect the sidewalls of the first device and MTJ during the second device etch process. The second device etch configures the sidewalls of the second device. The etch can be a field etch. The etch can be a self aligned etch. The etch can be an anistropic etch. In one exemplary implementation, the second device etch is a EM Ion beam (EIB) etch. FIG. 3H is a block diagram of an exemplary second device etch process in accordance with one embodiment. The portions of the intermediate contact layer 371, DUT 302, MTJ 310, and bottom terminal layer 382 (including seed layer 383) not under first device sidewall insulators 121A and 121B are etched away and removed.

Figure 3I:
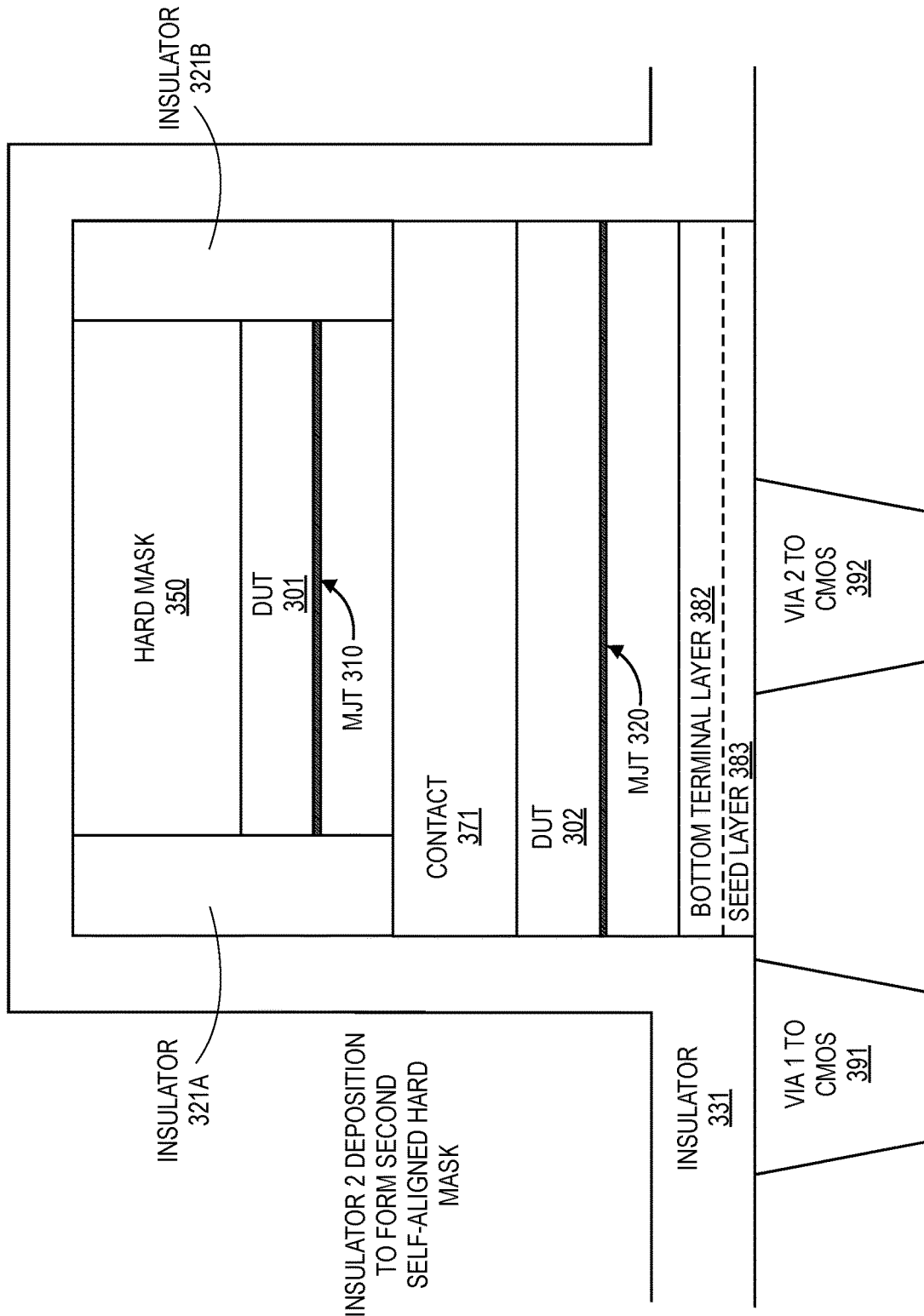
FIG. 3I is a block diagram of an exemplary insulator deposition in accordance with one embodiment.

In block 271, a second insulator process is performed. The sidewall insulator can insulate a sidewall of an intermediate contact, second device including a MTJ, and bottom terminal (including a seed layer). In on embodiment, a second insulator is deposited on the stack structure to cover the sidewall of the first insulator portions 321A and 321B, intermediate contact 371, and second device 302. FIG. 3I is a block diagram of an exemplary insulator deposition in accordance with one embodiment. Insulator 331 is deposited on top of the hard mask 350 and on the sidewall of the first insulator portions 321A and 321B, intermediate contact 371, second device 302, and bottom terminal layer 382 (including seed layer 383). The insulator 331 can also be deposited on other portions of the substrate. The insulator 331 can be deposited on other components in the substrate (e.g., via 391, 394, etc.).

Figure 3J:
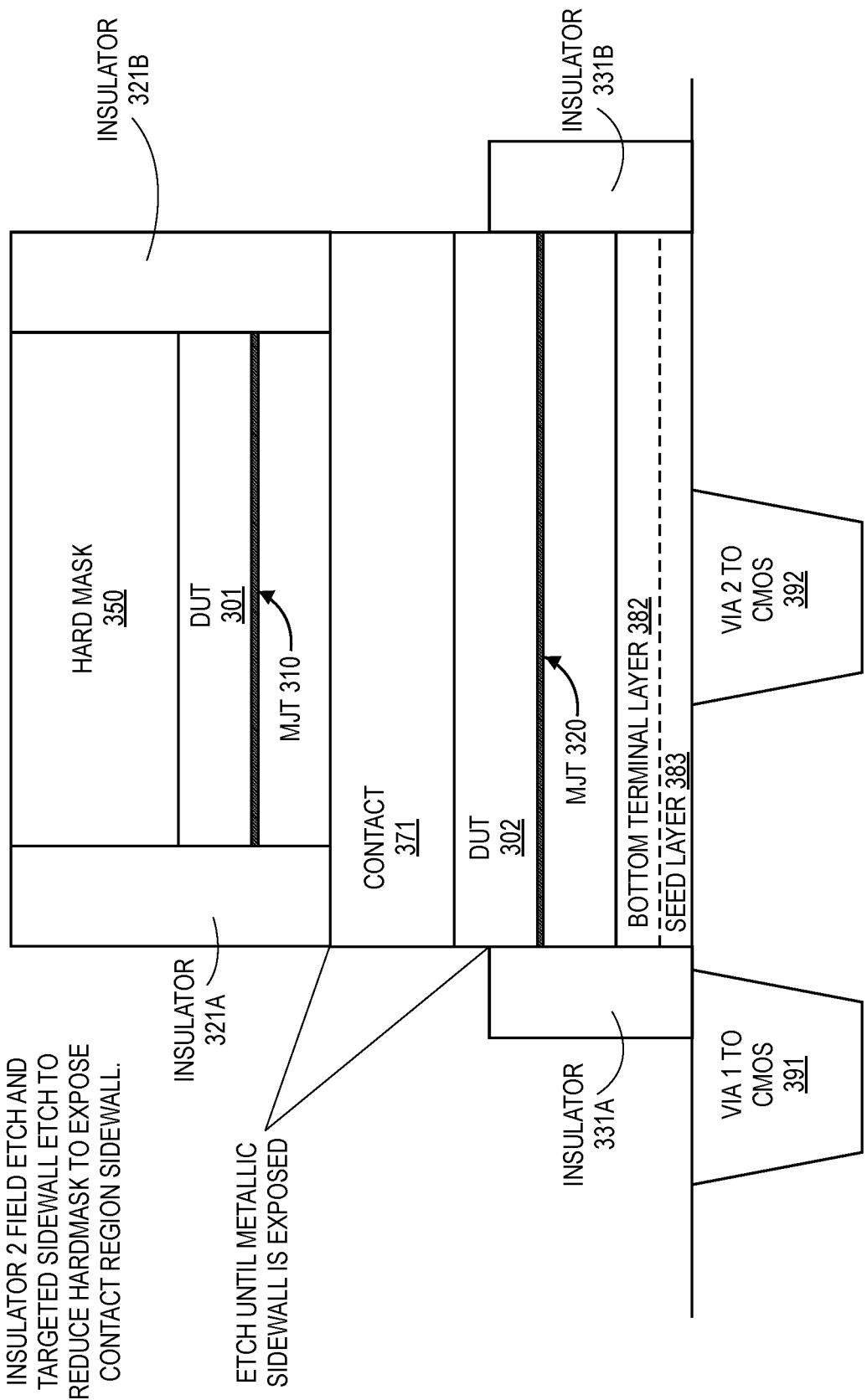
FIG. 3J is a block diagram of an exemplary second device etch in accordance with one embodiment.

The second insulator is subjected to an etch to form a sidewall insulation which also serves as a sidewall mask. The sidewall insulator can insulate a sidewall of an intermediate contact, a second device including a MTJ, and bottom terminal (including a seed layer). The second insulator is subjected to a field etch to form the sidewall insulation which also serves as a sidewall mask. FIG. 3J is a block diagram of an exemplary second device etch in accordance with one embodiment. In one embodiment, second insulator process includes a targeted sidewall etch to reduce the hard mask to expose a sidewall of the intermediate contact 371. The etch is performed until the metallic sidewall is exposed. After the etch, insulting portions 331A and 331B remain on the sidewalls of DUT 302 (including the sidewalls of MTJ 320).

Figure 3K:
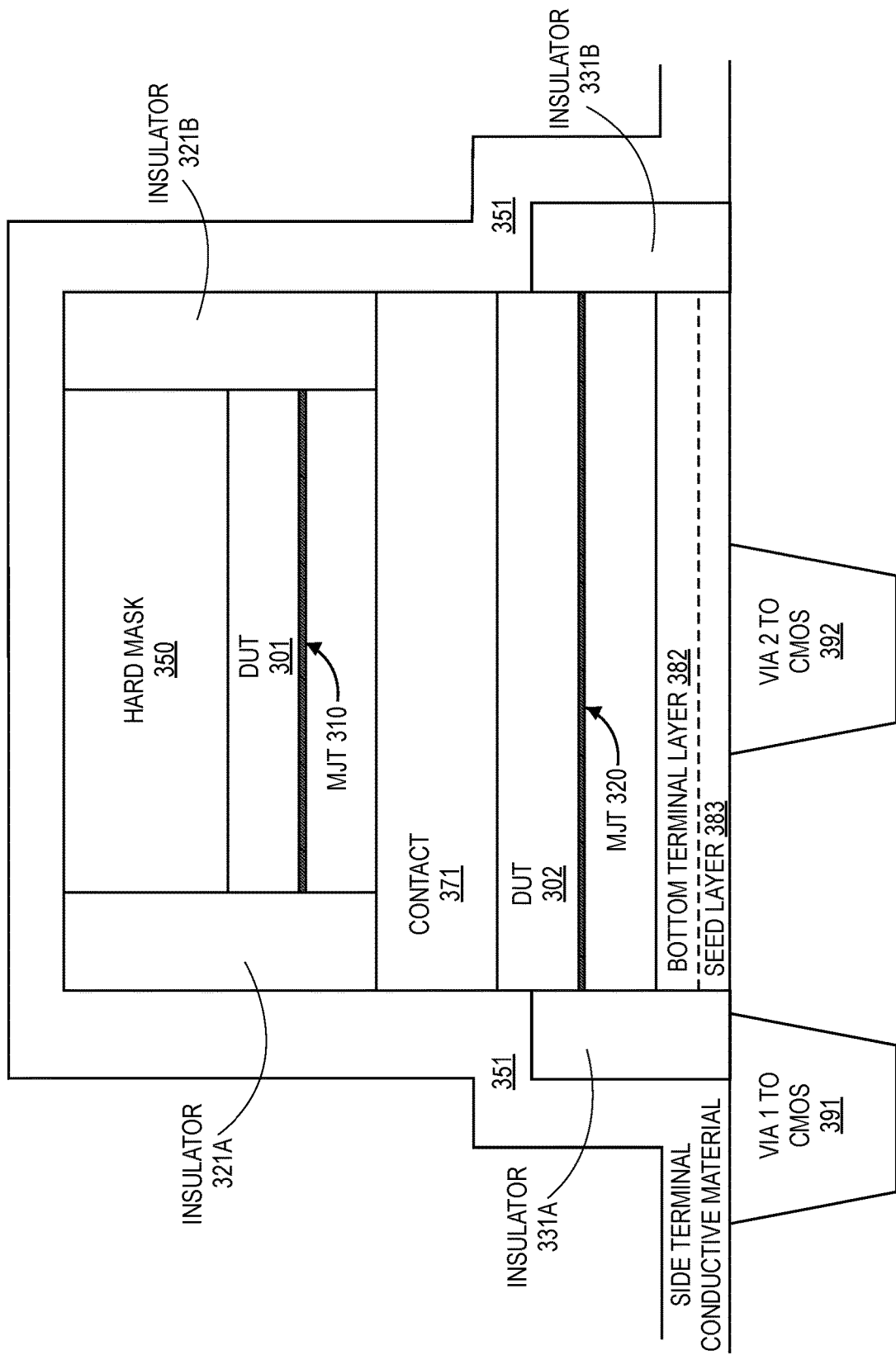
FIG. 3K is a block diagram of an exemplary interconnect contact layer in accordance with one embodiment.

In block 281, a side terminal layer process is performed in accordance with one embodiment. In one embodiment, the side terminal layer process is an interconnect contact layer process and includes metal contact deposition. The side terminal layer process deposits an electrically conductive material on the exposed sidewalls of the first insulator regions, second insulator regions, intermediate contact layer, and second device. FIG. 3K is a block diagram of an exemplary side terminal layer portion in accordance with one embodiment. The insulator 351 can also be deposited on other portions of the substrate. The insulator 351 can be deposited on other components in the substrate (e.g., via 391, 394, etc.).

In one embodiment, processes are performed to electrically insulate the stack of devices from other stacks of devices. In one exemplary implementation, an electrically insulated stack of devices can be electrically coupled to other stacks of devices by the external terminals.

Figure 3L:
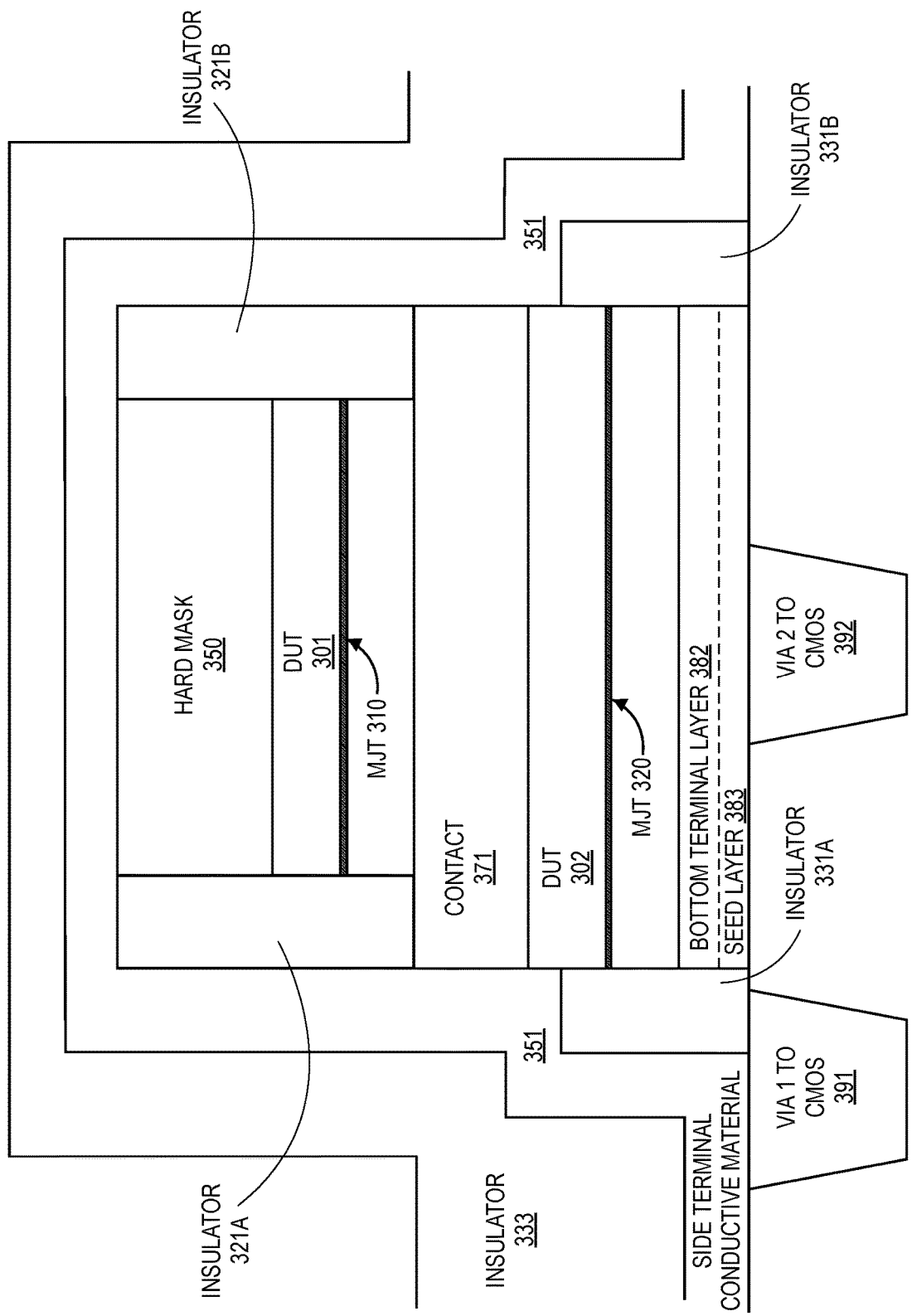
FIG. 3L is a block diagram of an exemplary third insulator deposition in accordance with one embodiment.
Figure 3M:
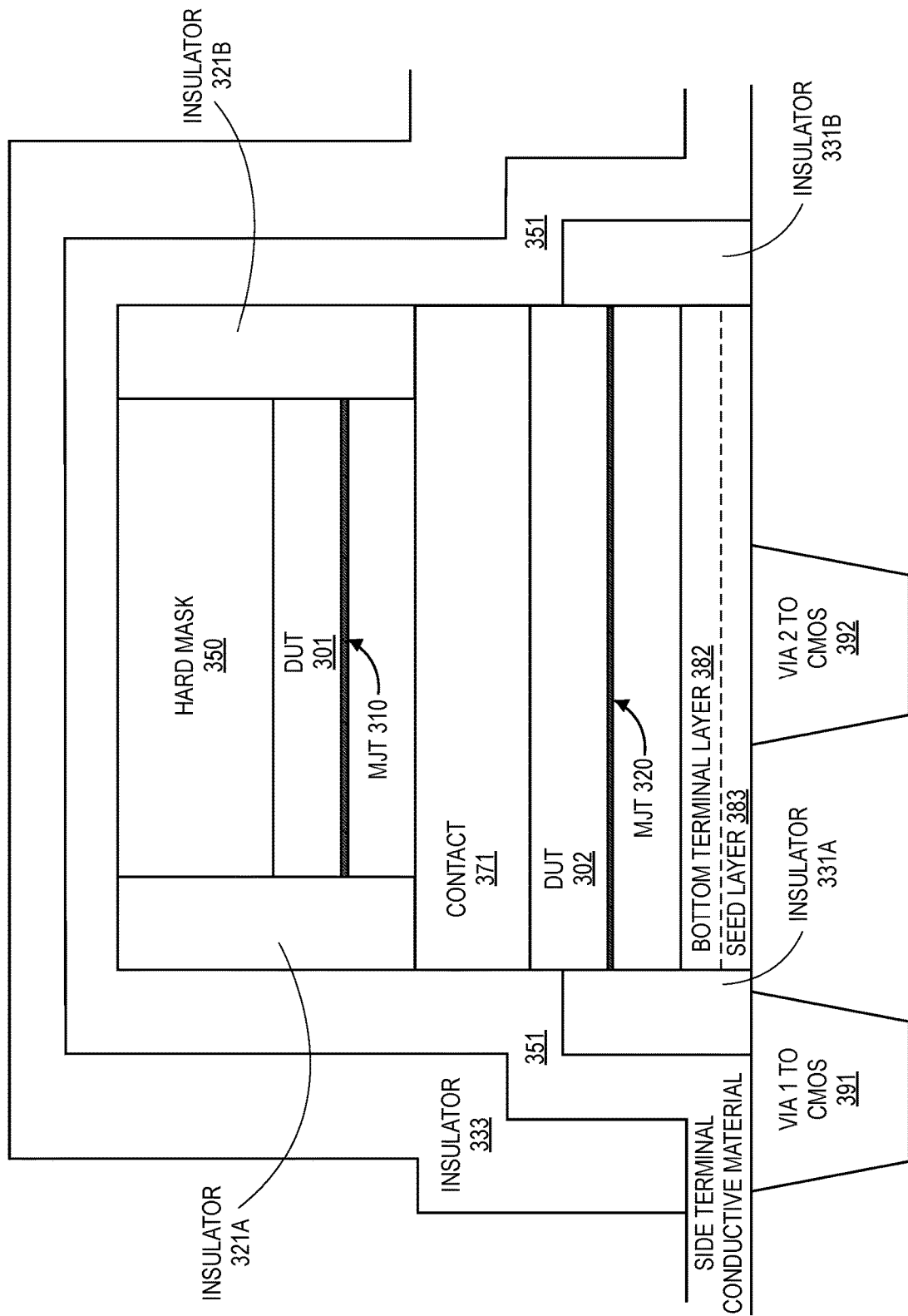
FIG. 3M is a block diagram of an exemplary third insulator etch in accordance with one embodiment.
Figure 3N:
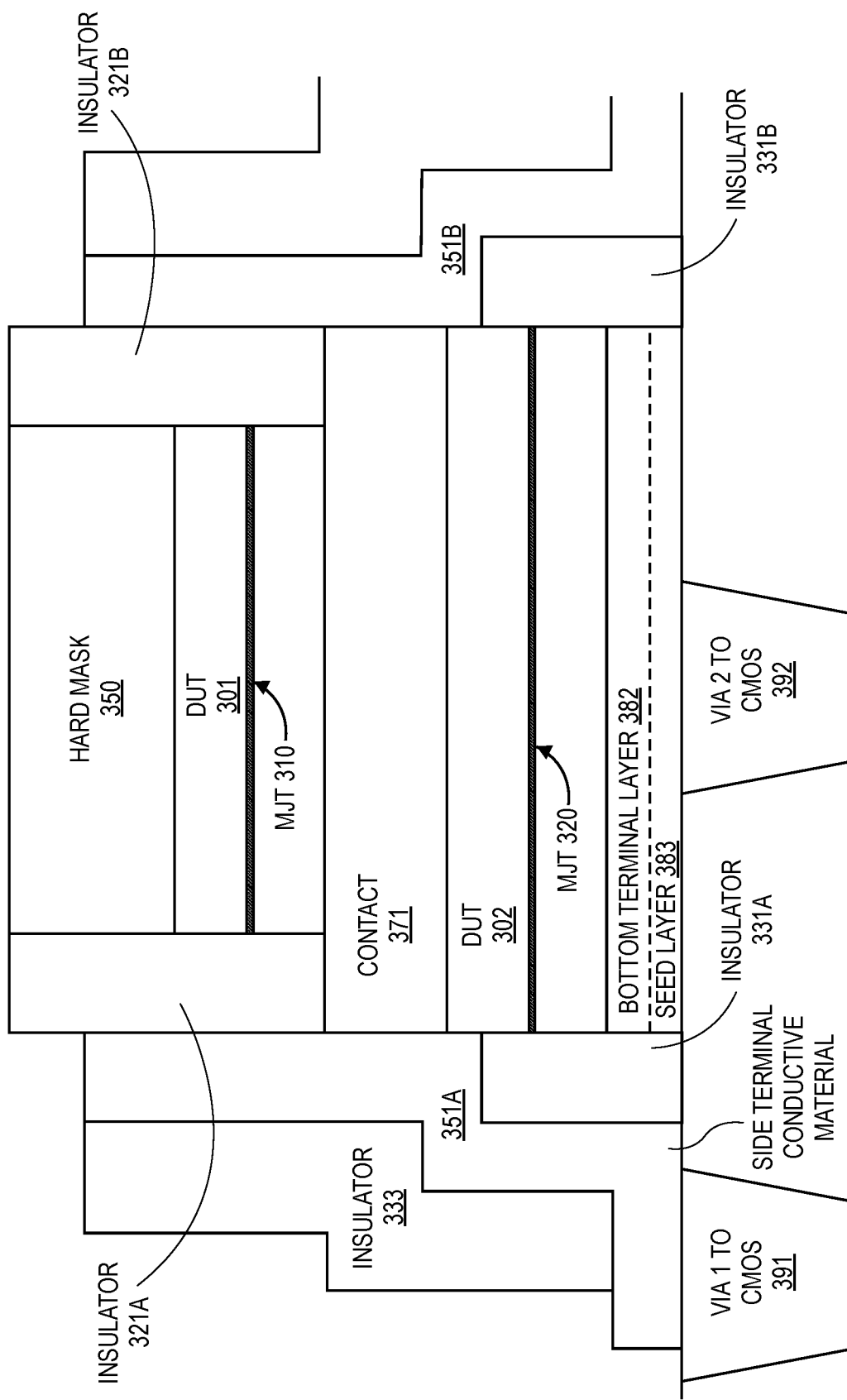
FIG. 3N is a block diagram of an exemplary targeted sidewall etch in accordance with one embodiment.
Figure 3O:
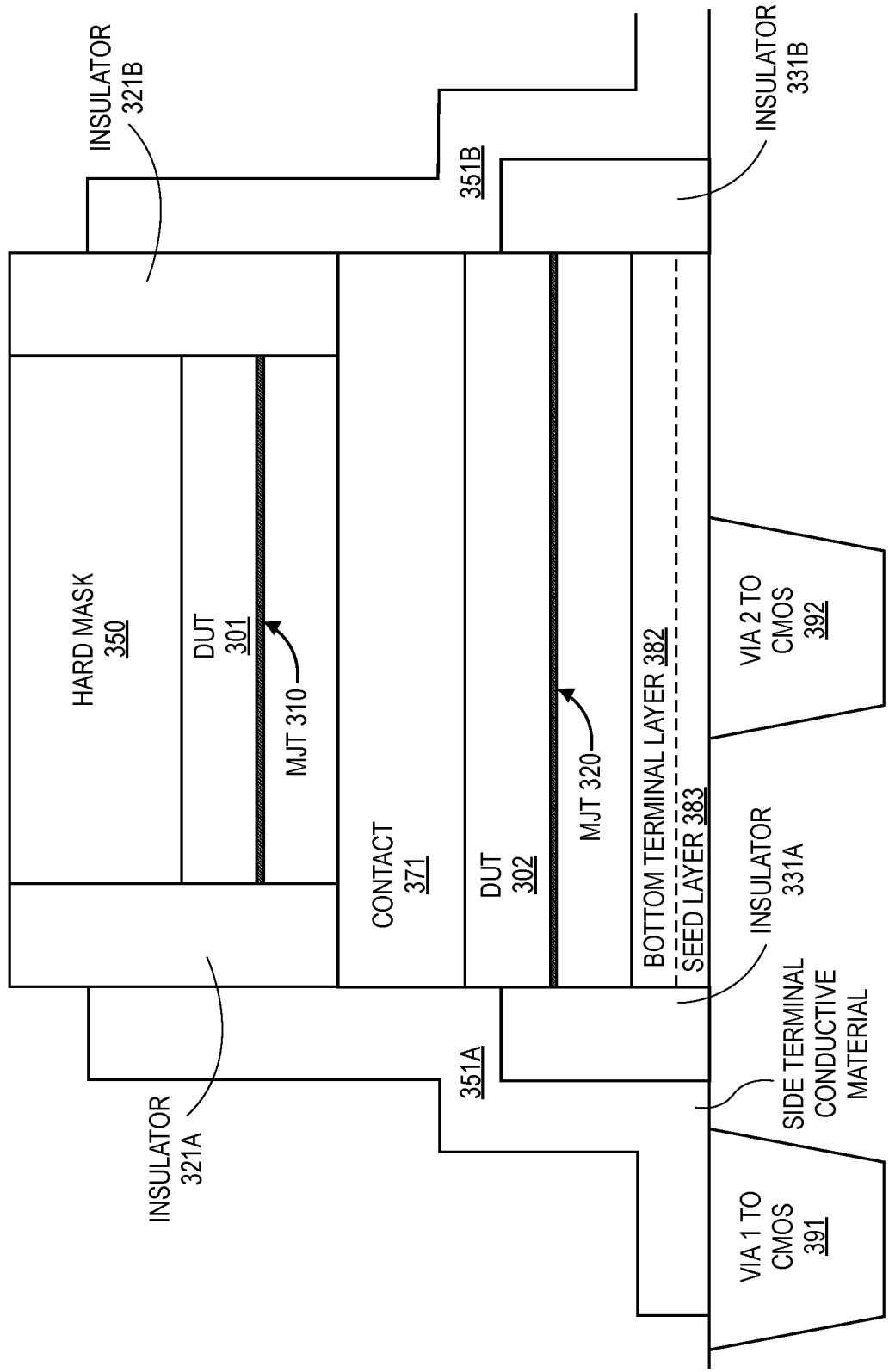
FIG. 3O is a block diagram of an exemplary third insulator etch and removal in accordance with one embodiment.

In block 291, a third insulator process is performed. The third insulator is deposited on the stack structure to cover the side terminal layer. The third insulator can be utilized as a self aligned mask. The self aligned mask can be utilized to facilitate via to sidewall terminal formation. FIG. 3L is a block diagram of an exemplary third insulator deposition in accordance with one embodiment. Insulator 333 is deposited on side terminal layer 351. The third insulator is subjected to a field etch to complete the self aligned hardmask. FIG. 3M is a block diagram of an exemplary third insulator etch in accordance with one embodiment. In one embodiment, a third insulator process includes a targeted sidewall etch to reduce the hard mask to complete the via to side terminal formation metal etch. The etch can be performed until the metallic sidewall is exposed. FIG. 3N is a block diagram of an exemplary targeted sidewall etch in accordance with one embodiment. In one embodiment, the etch results in dividing side terminal 351 of FIG. 3M into a first part side terminal 351A and a second part side terminal 351B. The metallic sidewall tops of first part side terminal 351A and a second part side terminal 351B are exposed. The third insulator is etched and removed. FIG. 3O is a block diagram of an exemplary third insulator etch and removal in accordance with one embodiment.

Figure 3P:
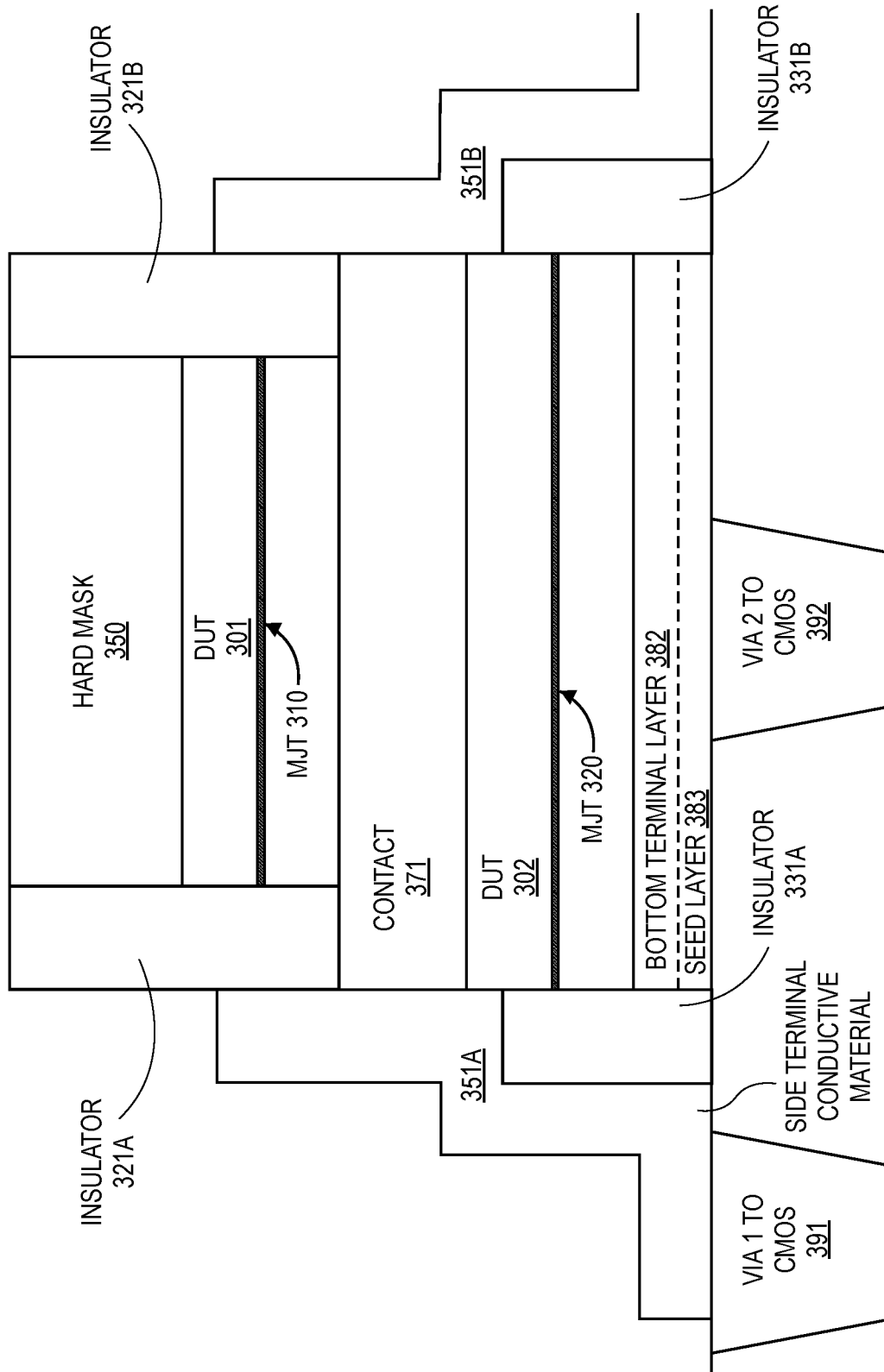
FIG. 3P is a block diagram of an exemplary metal trim in accordance with one embodiment.

An optional metal trim process can be performed. The metal trim can lower metal from top of the device. FIG. 3P is a block diagram of an exemplary metal trim in accordance with one embodiment. In one exemplary implementation, the tops of side terminals 351A and 351B are lowered.

Figure 3Q:
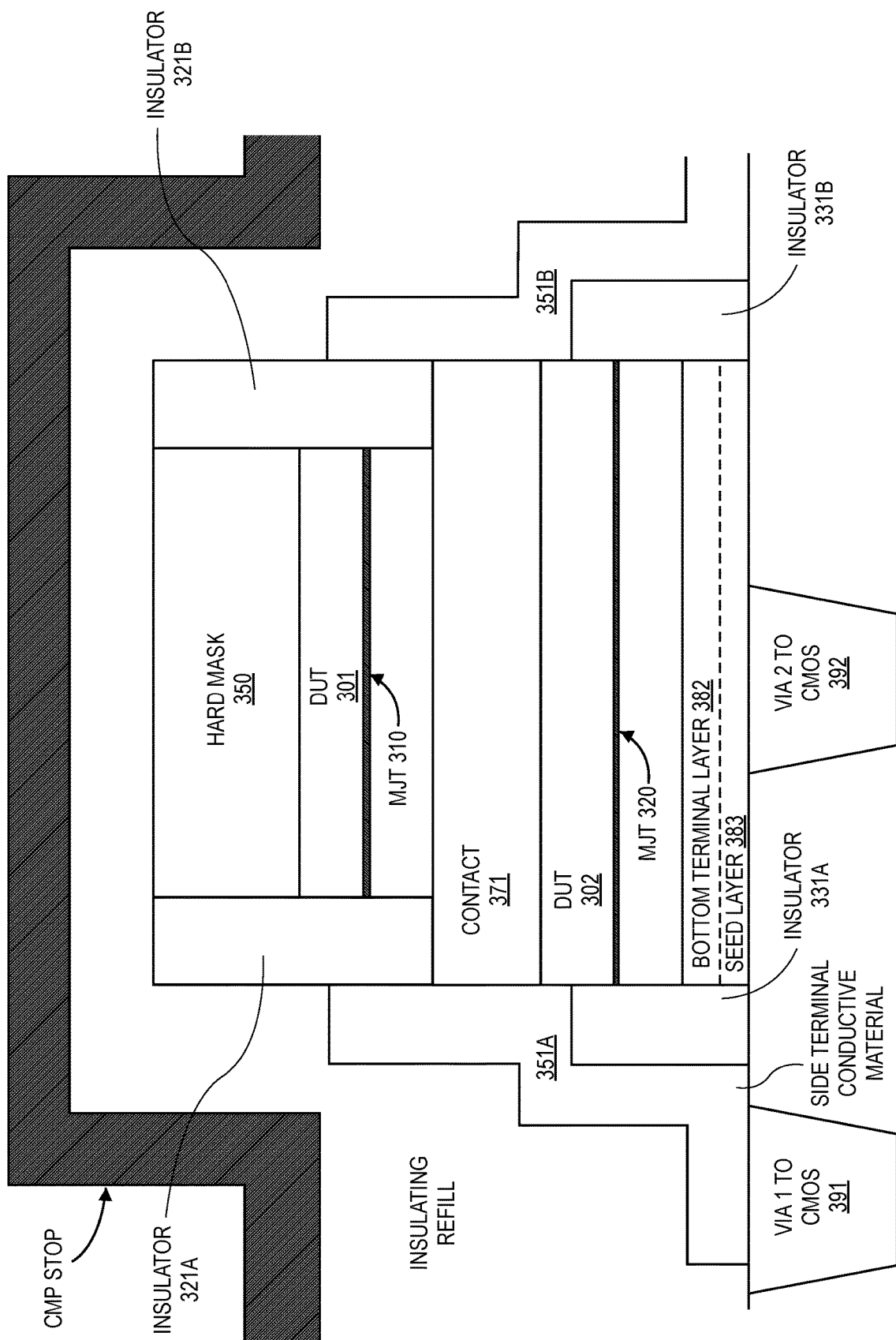
FIG. 3Q is a block diagram of an exemplary CMP an insulating refill in accordance with one embodiment.
Figure 3R:
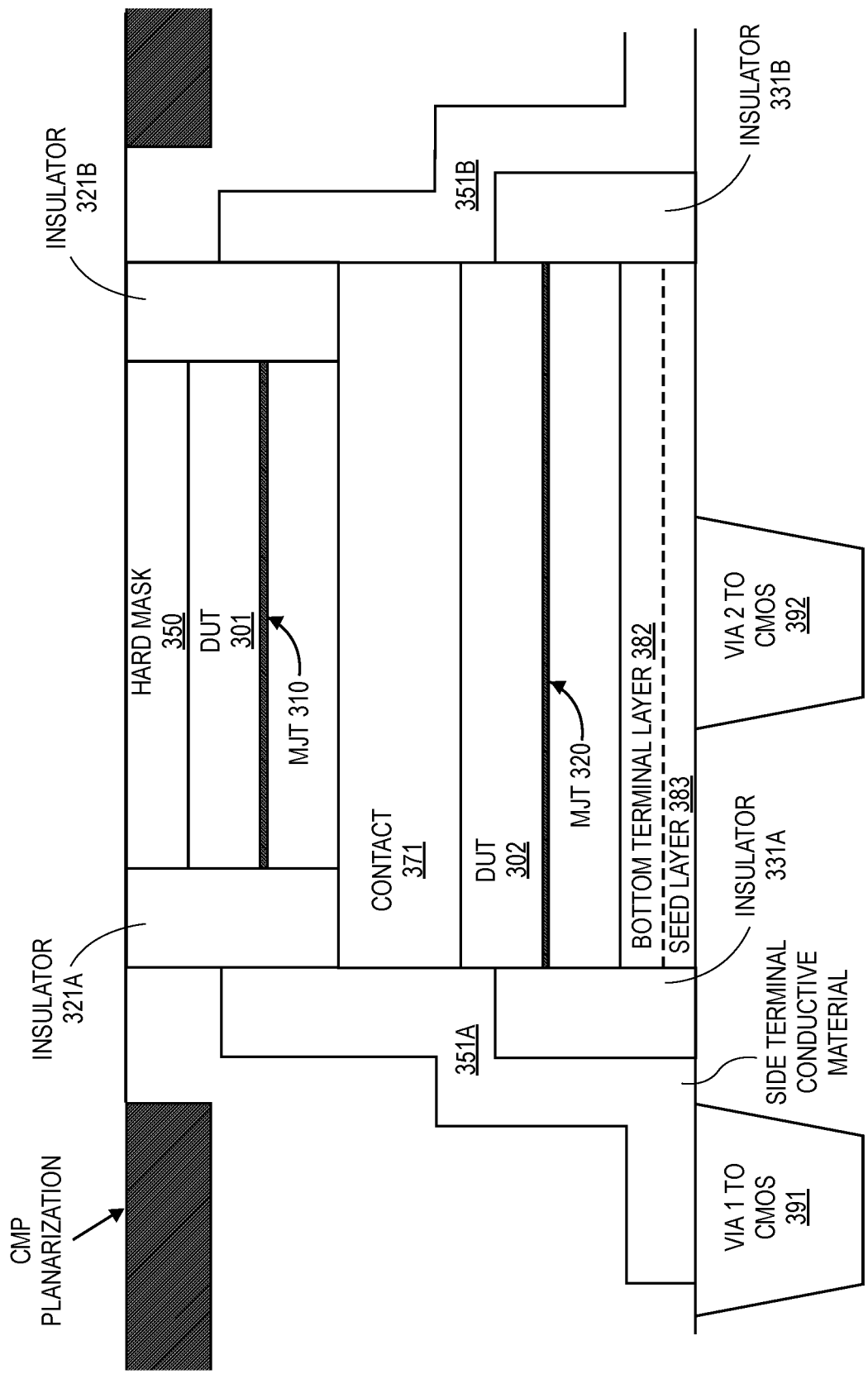
FIG. 3R is a block diagram of an exemplary planarization in accordance with one embodiment.

In block 293, a CMP and insulating refill process is performed. FIG. 3Q is a block diagram of an exemplary CMP an insulating refill in accordance with one embodiment. In one embodiment, hard mask 350 is planarized. In one exemplary implementation, the CMP planarization exposes the top of the DUT 301. FIG. 3R is a block diagram of an exemplary planarization in accordance with one embodiment.

Figure 3S:
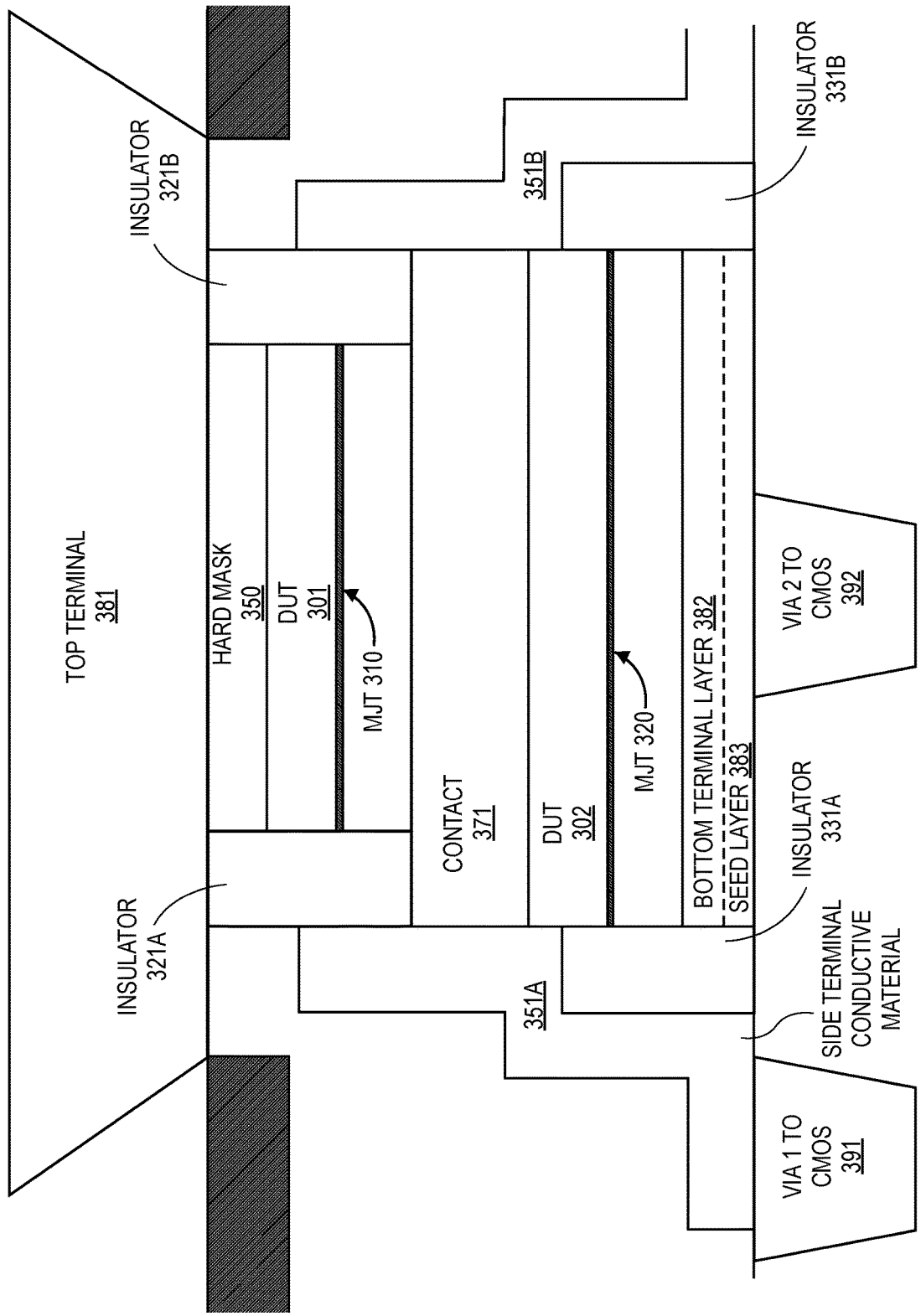
FIG. 3S is a block diagram of an exemplary first terminal formation in accordance with one embodiment.

In block 294, a top terminal formation process is performed. The first terminal can include a top contact. FIG. 3S is a block diagram of an exemplary first terminal formation in accordance with one embodiment. Top terminal 381 is deposited on hard mask 350. In one embodiment, hard mask 350 is removed and top terminal 381 is deposited on DUT 301.

In one embodiment, the insulating material on the side walls of the stack of devices can protect the sidewall of the devices so that there is very little or no re-deposition of etched material on the sidewalls of devices in the stack or pillar. In one exemplary implementation, materials that are hard to remove or etch without re-deposition (e.g., iridium (Ir), platinum (Pt), ruthenium (Ru) metals, etc.) are prevented from contacting the side walls. This can be critical since these materials typically do not easily oxidize and can significantly damage performance if re-deposited on device components in the stack. In one embodiment, the self-aligned side wall insulators can reduce or eliminate the need for high angle mill cleaning, enabling higher density of stacks or pillars.

While multi terminal stacked device method 200 has been described with reference to devices stacked in a pillar configuration, it is appreciated similar fabrication process can be utilized to fabricate multi terminal devices in other stack configurations. The bottom terminal and top terminal can be independent terminals (e.g., top terminal 381, bottom terminal 382, etc.). In one embodiment, a side terminal can be an independent terminal of a device. In one exemplary implementation, a side terminal can be a common terminal to multiple devices. In one embodiment, a multi terminal stacked device method uses a self-aligned process to build three electrical terminals on a vertical heterostructrure device.

Figure 4A:
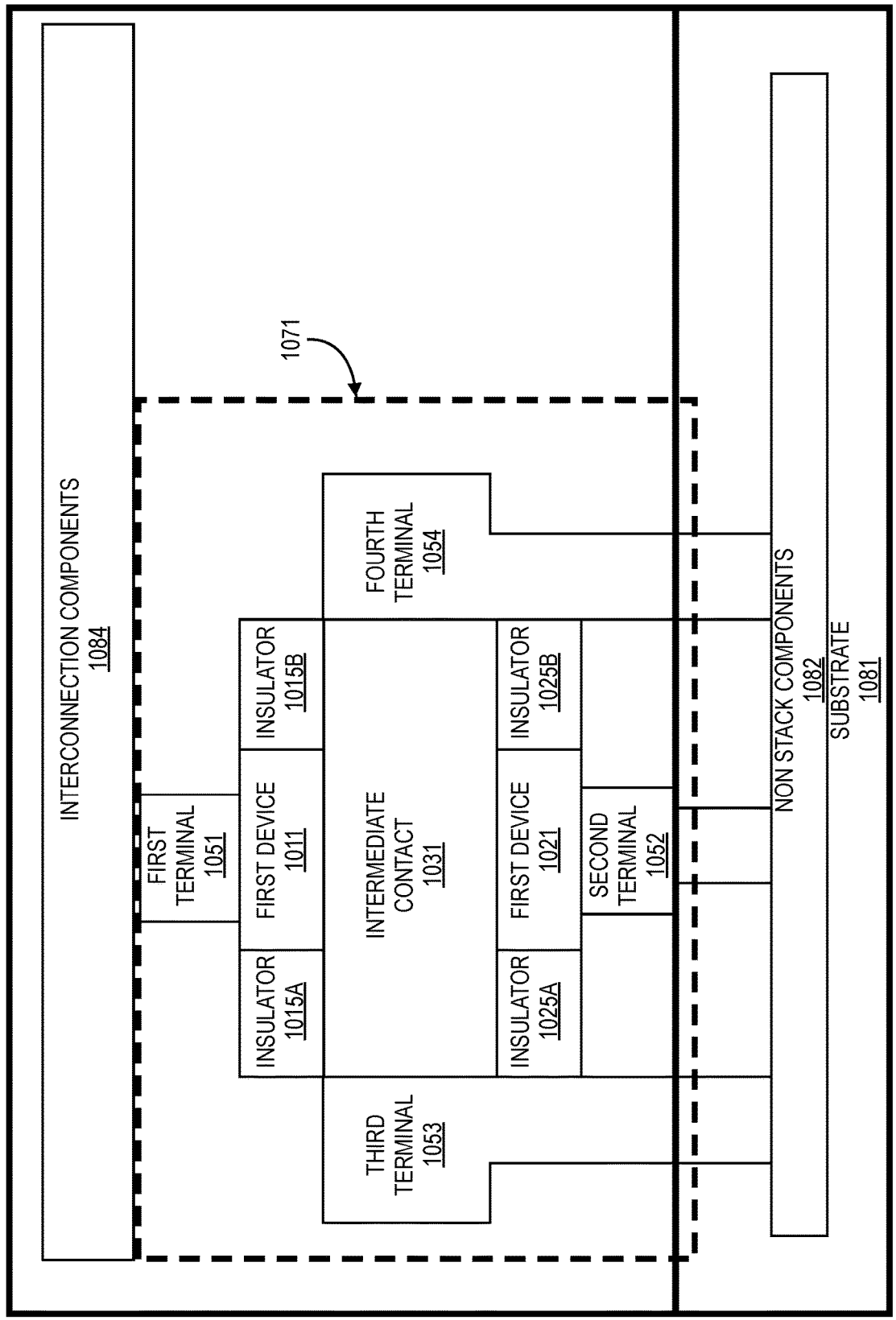
FIG. 4A is a block diagram of a portion of an exemplary semi-conductor in accordance with one embodiment.

In one embodiment, a multi terminal stack includes a fourth terminal. A fourth terminal can be utilized for several reasons (e.g., an additional independent terminal, increase the current capacity of a terminal, etc.). FIG. 4A is a block diagram of a portion of an exemplary semi-conductor in accordance with one embodiment. The semi conductor includes a multi terminal stack 1071, non-stack components 1082 included in substrate 1081, and interconnection components 1084. Multi terminal 1071, includes first device 1011, second device 1021, intermediate contact 1031, a first terminal 1051, a second terminal 1052, a third terminal 1053, a fourth terminal 1054, and insulators 1015A, 1015B, 1025A, and 1025B. In one embodiment, components of the semi conductor that includes multi terminal stack 1071 are similar to components in multi terminal stack 71 of FIG. 1, except multi terminal stack 1071 includes a fourth terminal 1054. Fourth terminal 1054 is a side terminal. In one embodiment, fourth terminal 1054 is coupled to intermediate contact 1031.

Figure 4B:
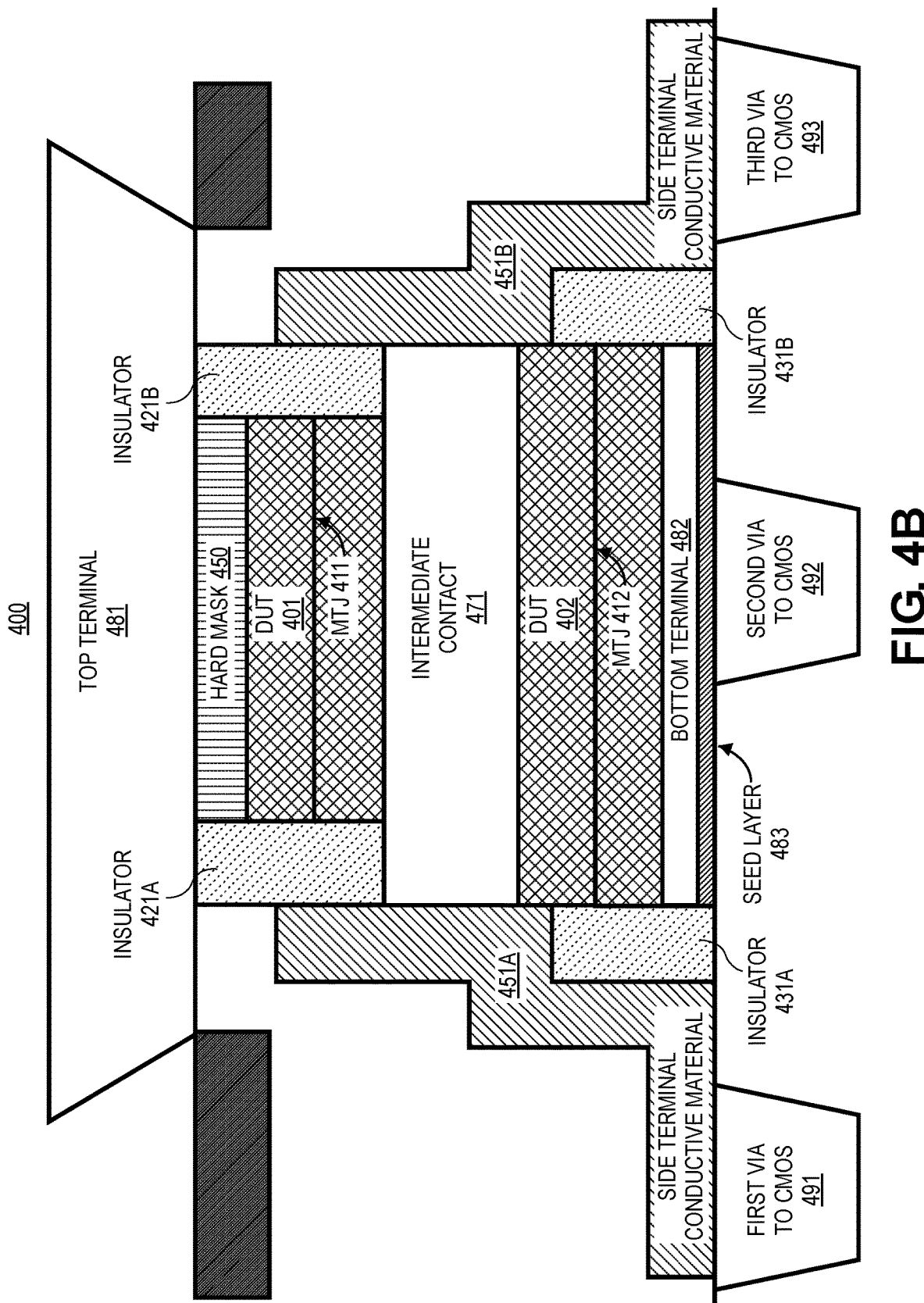
FIG. 4B is a block diagram of an exemplary multi terminal stack in accordance with one embodiment.

A fourth terminal can be included in a MTJ device stack. FIG. 4B is a block diagram of an exemplary multi terminal stack in accordance with one embodiment. In one embodiment, multi terminal stack is similar to the multi terminal stack in FIG. 1B except there is a fourth terminal 451B.

Multi terminal stack 400 includes DUT 401, DUT 402, intermediate contact 471, hard mask 450, bottom terminal layer 482 with seed layer 483, insulators 421A, 421B, 431A, and 431B, a sidewall terminal portion 451A and a sidewall terminal portion 451B. DUT 401 includes MTJ 411. DUT 402 includes MTJ 412. DUT 401 and DUT 402 are coupled to intermediate contact layer 471. Sidewall terminal portion 451A and sidewall terminal portion 451B are coupled to intermediate contact layer 471. Sidewall terminal portion 451A is also coupled to first via 491 and sidewall metal contact 451B is also coupled to third via 493. The multi terminal stack 400 is coupled to top contact 481 and to bottom second via 492. In one embodiment, the bottom terminal layer 482 extends down to contact the second via 192. In one exemplary implementation, first via 491, second via 492, and third via 493 are respectively coupled to complimentary metal on silicon transistors (CMOSs). In one embodiment, multi terminal stack 400 includes a first terminal, a second terminal, a third terminal and a fourth terminal.

Figure 4C:
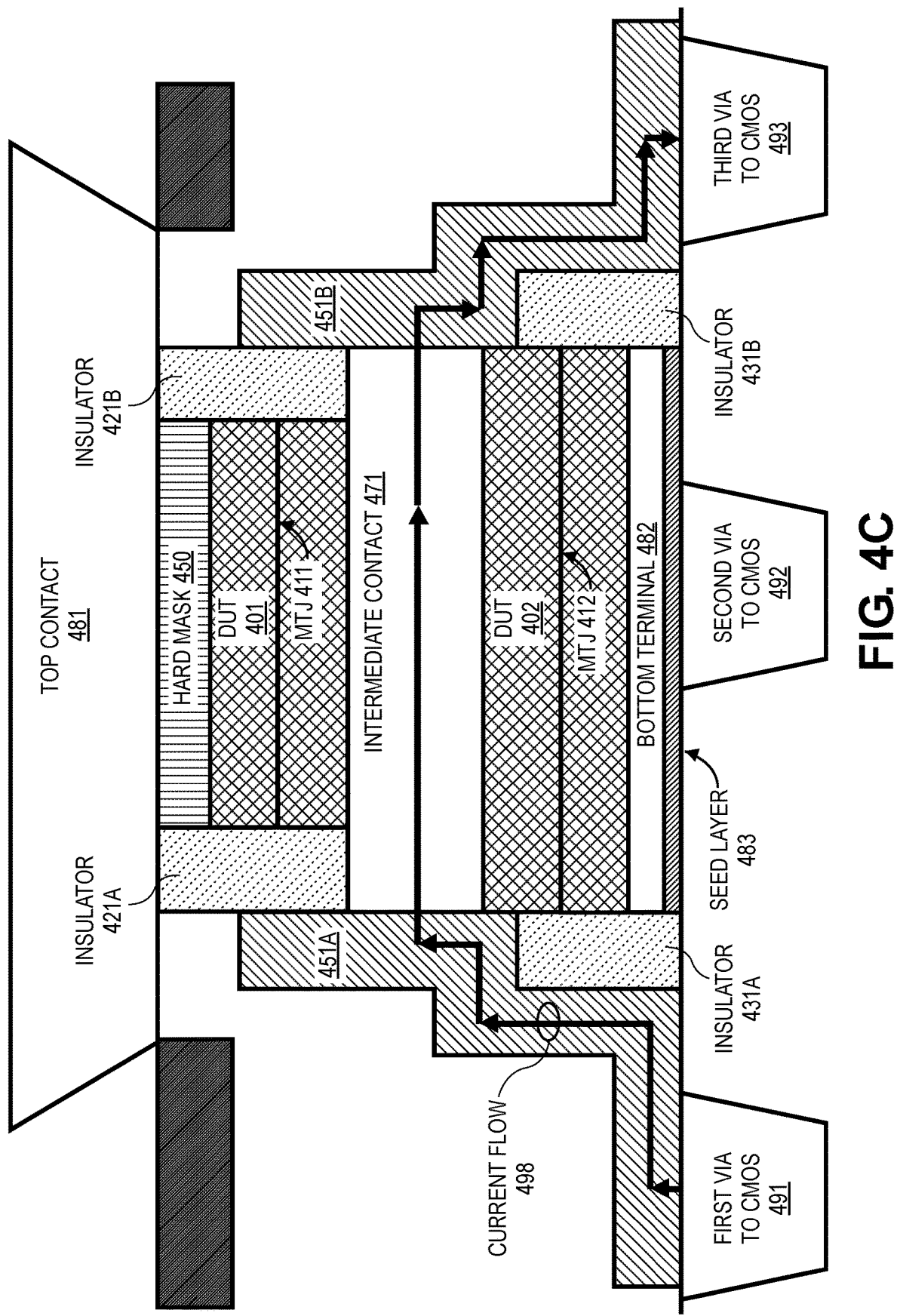
FIG. 4C is a block diagram of an exemplary multi terminal stack current flow in accordance with one embodiment.
Figure 4D:
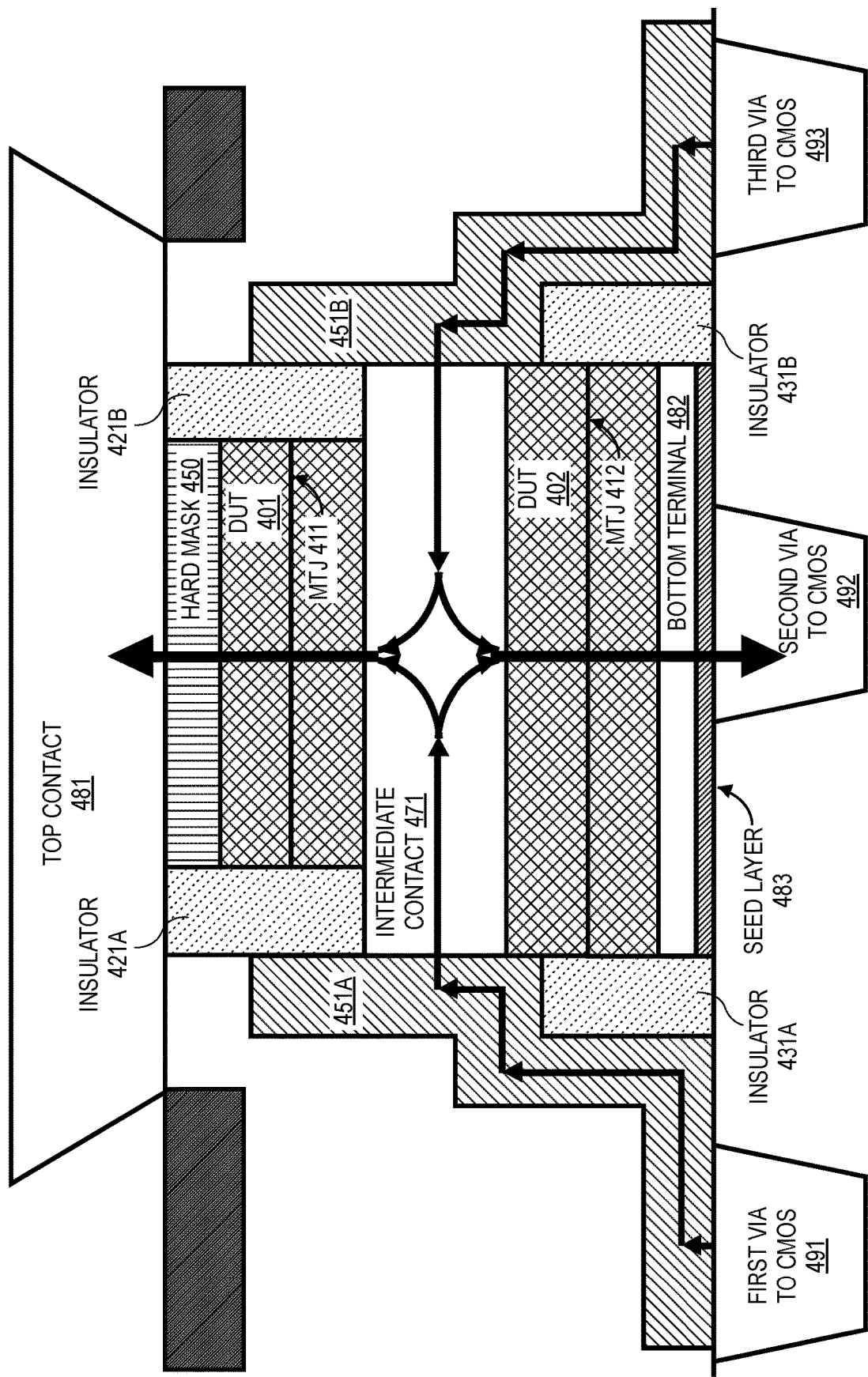
FIG. 4D is a block diagram of an exemplary multi terminal stack current flow in accordance with one embodiment.

In one embodiment, the current flow is from the third terminal to the fourth terminal. FIG. 4C is a block diagram of an exemplary multi terminal stack current flow 498 in accordance with one embodiment. In one embodiment, two transistors can be used to source each MTJ doubling current drive capability increasing lower bound on retention. In one exemplary implementation, current flows from a third terminal and a fourth terminal to a first terminal and a second terminal. FIG. 4D is a block diagram of an exemplary multi terminal stack current flow in accordance with one embodiment.

Figure 5:
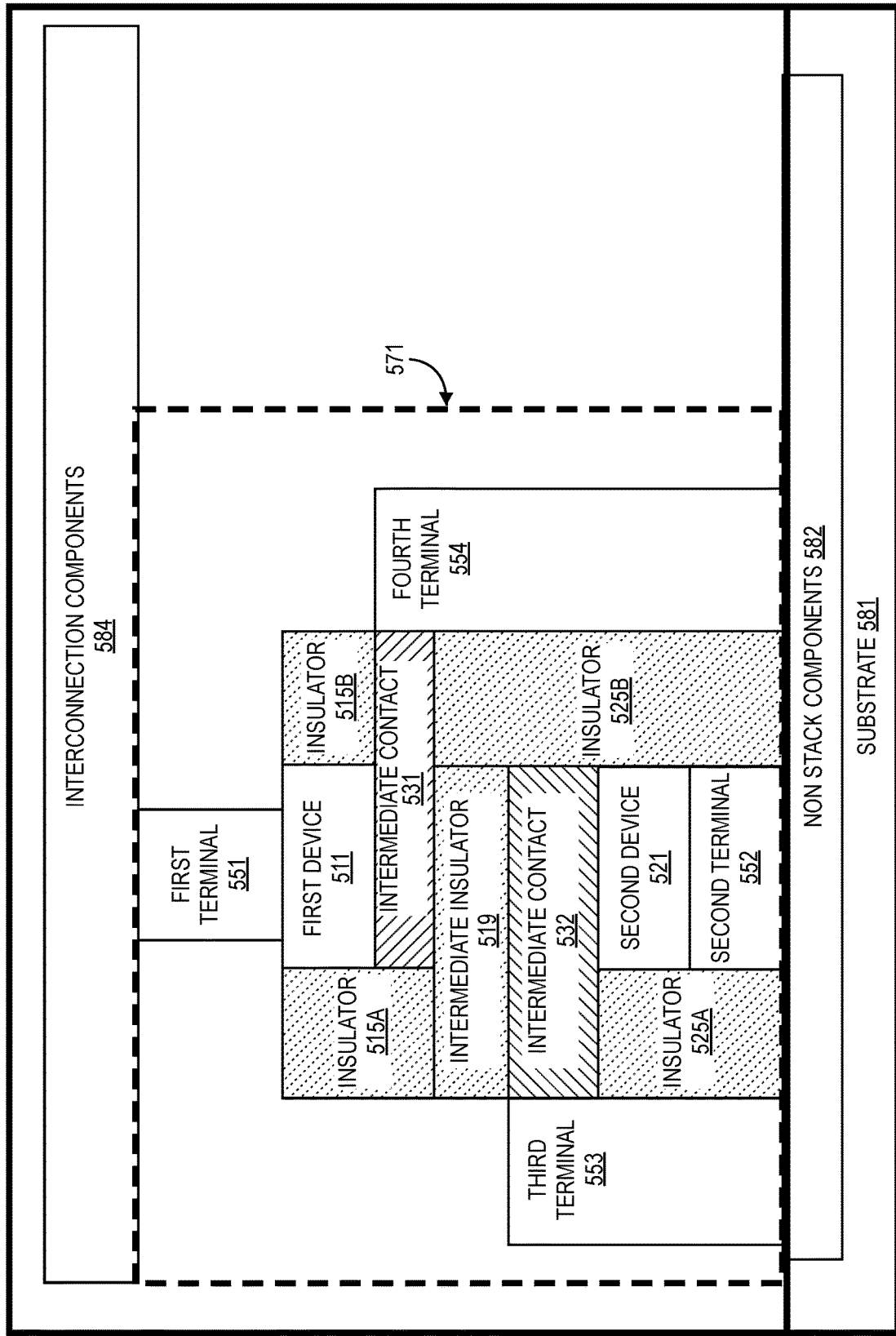
FIG. 5 is a block diagram of a portion of an exemplary semi-conductor in accordance with one embodiment.

FIG. 5 is a block diagram of a portion of an exemplary semi-conductor in accordance with one embodiment. The semi conductor includes a multi terminal stack 571, non-stack components 582 included in substrate 581, and interconnection components 584. Multi terminal 571, includes first device 511, second device 521, intermediate contact 531, intermediate contact 532, a first terminal 551, a second terminal 552, a third terminal 553, a fourth terminal 554, intermediate insulator 519, and insulators 515A, 515B, 525A, and 525B. In one exemplary implementation, insulators 515A and 515B form separate insulators, and similarly 525A and 525B form separate insulators. In one embodiment, portions 515A and 515B wrap around the pillar to form a single insulator, and similarly portions 525A and 525B wrap around the pillar to form a single insulator. In one embodiment, components of the semi conductor that includes multi terminal stack 571 are similar to components in multi terminal stack 771 of FIG. 4, except there are two intermediate contacts 531 and 532 with an intermediate insulator 519 between them. In one embodiment, third terminal 553 is coupled to intermediate contact 532, and fourth terminal 554 is coupled to intermediate contact 531.

Figure 6:
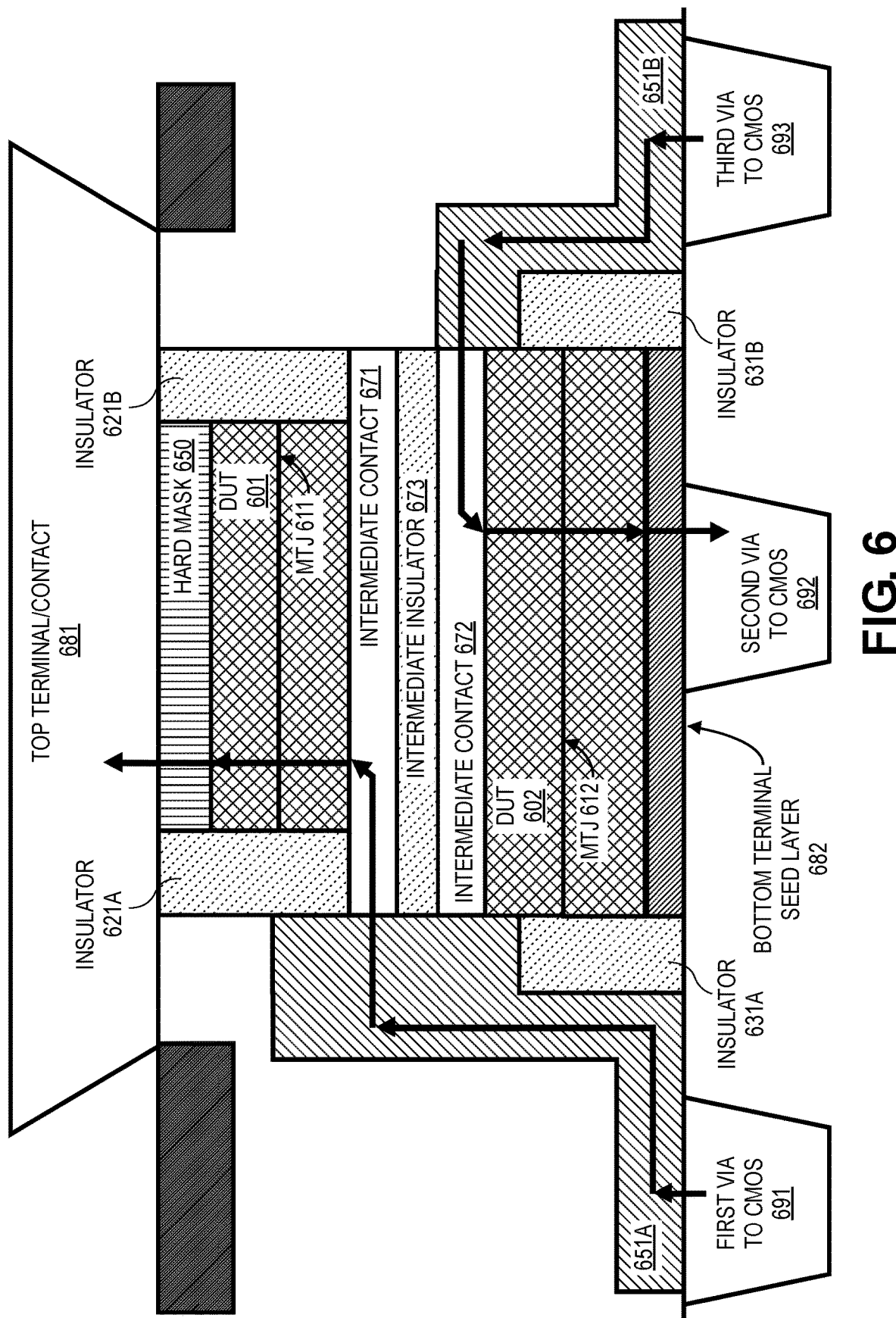
FIG. 6 is a block diagram of an exemplary multi terminal stack 600 in accordance with one embodiment.

FIG. 6 is a block diagram of an exemplary multi terminal stack in accordance with one embodiment. In one embodiment, the multi terminal stack is similar to the multi terminal stack in FIG. 4B except there is two intermediate contacts with an intermediate insulator in between them. Multi terminal stack 600 includes DUT 601, DUT 602, intermediate contact 671, intermediated contact 672, hard mask 650, top terminal 681, bottom terminal layer 682 with a seed layer, insulators 621A, 621B, 631A, and 631B, a sidewall terminal portion 651A and a sidewall terminal portion 651B. DUT 601 includes MTJ 611. DUT 602 includes MTJ 612. DUT 601 is coupled to intermediate contact 671. DUT 602 is coupled to intermediate contact 672. Sidewall terminal portion 651A is coupled to intermediate contact 671. Sidewall terminal portion 651B is coupled to intermediate contact 672. Sidewall terminal portion 651A is also coupled to first via 691 and sidewall terminal portion 651B is also coupled to third via 693. The multi terminal stack is coupled to top contact 681 and to bottom second via 692. In one embodiment, the bottom terminal layer 682 extends down to contact the second via 692. In one exemplary implementation, first via 691, second via 692, and third via 693 are respectively coupled to complimentary metal on silicon transistors (CMOSs). In one embodiment, the current flow is from the side wall third terminal 651A through intermediate contact 671 and DUT 601 to the first top terminal 681. Current can also flow from the side wall fourth terminal 651B intermediate contact 672 and DUT 602 to the second bottom terminal 682. In one embodiment, third terminal 651A and fourth 651B are separate terminals.

Figure 7:
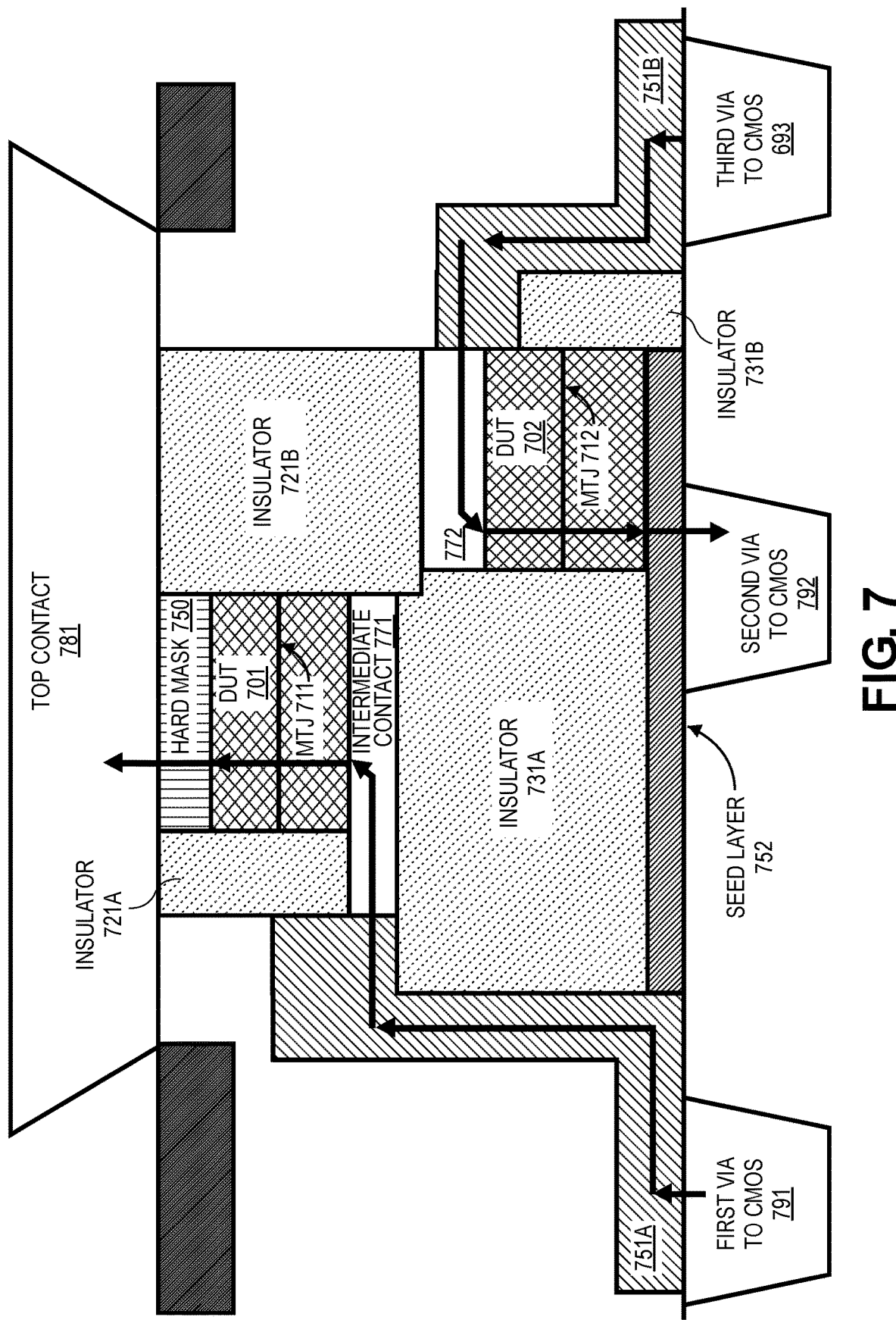
FIG. 7 is a block diagram of an exemplary multi terminal stack 700 in accordance with one embodiment.

FIG. 7 is a block diagram of an exemplary multi terminal stack in accordance with one embodiment. In one embodiment, the multi terminal stack is similar to the multi terminal stack in FIG. 4B except there is two intermediate contacts with an intermediate insulator in between them. The multi terminal stack includes DUT 701, DUT 702, intermediate contact 771, intermediated contact 772, hard mask 750, top terminal 781, bottom terminal layer 782 with seed layer 783, insulators 721A, 721B, 731A, and 731B, a sidewall terminal portion 751A and a sidewall terminal portion 751B. DUT 901 includes MTJ 711. DUT 902 includes MTJ 712. DUT 901 is coupled to intermediate contact 771. DUT 902 is coupled to intermediate contact 772. In one embodiment, third terminal 751A and fourth 751B are separate terminals. Sidewall terminal portion 751A is coupled to intermediate contact 771. Sidewall terminal portion 751B is coupled to intermediate contact 772. Sidewall terminal portion 751A is also coupled to first via 791 and sidewall terminal portion 751B is also coupled to third via 793. The multi terminal stack is coupled to top contact 781 and to bottom second via 792. In one embodiment, the bottom terminal layer 782 extends down to contact the second via 792. In one exemplary implementation, first via 791, second via 792, and third via 793 are respectively coupled to complimentary metal on silicon transistors (CMOSs). In one embodiment, the current flow is from the side wall third terminal 751A through intermediate contact 771 and DUT 701 to the first top terminal 781. Current can also flow from the side wall fourth terminal 751B intermediate contact 772 and DUT 702 to the second bottom terminal 782.

Figure 8:
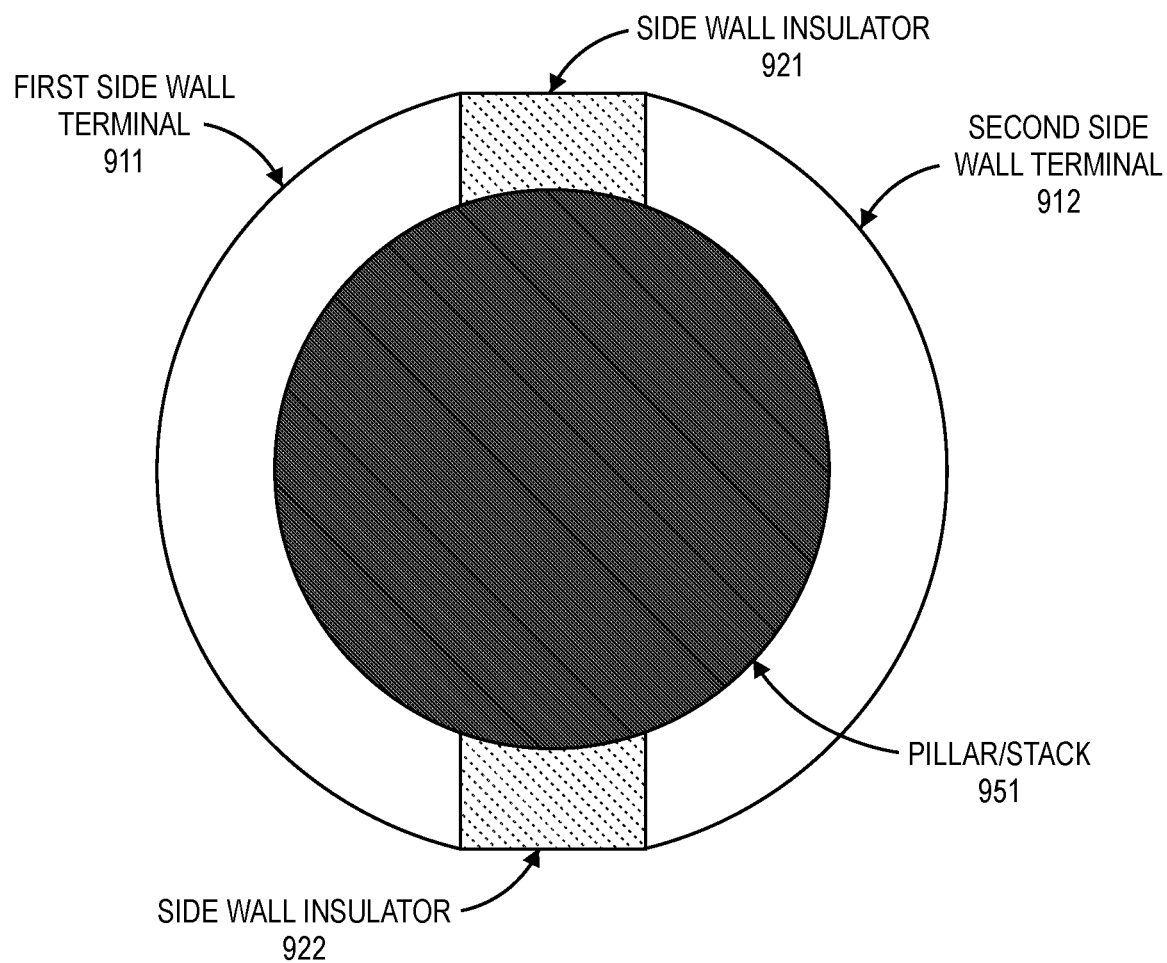
FIG. 8 is a top cut out view of a pillar stack in accordance with one embodiment.

It is appreciated there are a variety of way of forming side wall terminals. FIG. 8 is a top cut out view of a pillar stack in accordance with one embodiment. The cut out is through the side wall terminals. The side wall terminal portion 911 and second side wall terminal portion are separate terminals. The pillar stack 951 has a first side wall terminal portion 911 and second side wall terminal portion 912 separated by side wall insulator portion 921 and 922.

Figure 9:
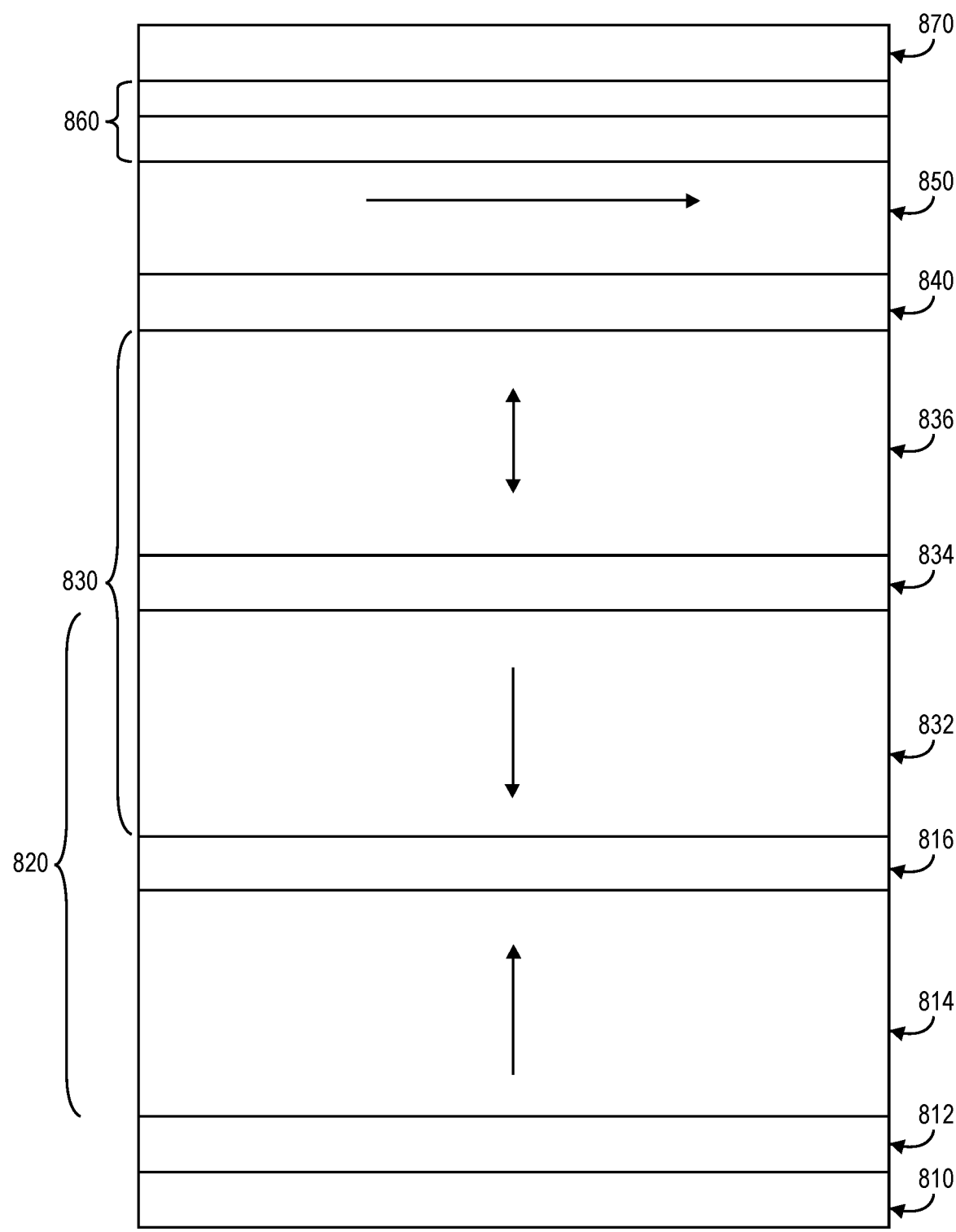
FIG. 9 illustrates a magnetic tunnel junction ("MTJ") in accordance with one embodiment.

FIG. 9 illustrates a magnetic tunnel junction ("MTJ") 800 in accordance with one embodiment. MTJ 800 includes one or more seed layers 810 provided at the bottom of stack 800 to initiate a desired crystalline growth in the above-deposited layers. An antiferromagnetic layer 812 is disposed over seed layers 810. MTJ 830 is deposited on top of synthetic antiferromagnetic (SAF) layer 820. MTJ 830 includes reference layer 832, which is a magnetic layer, a non-magnetic tunneling barrier layer 834, and the free layer 836, which is also a magnetic layer. The non-magnetic tunneling barrier layer 834 can be an insulator. It should be understood that reference layer 832 can actually be part of SAF layer 820, but forms one of the ferromagnetic plates of MTJ 830 when the non-magnetic tunneling barrier layer 834 and free layer 836 are formed on reference layer 832. As shown in FIG. 8, magnetic reference layer 832 has a magnetization direction perpendicular to its plane. As also illustrated in FIG. 8, free layer 836 also has a magnetization direction perpendicular to its plane, but its direction can vary by 180 degrees.

The first magnetic layer 814 is disposed over seed layer 810. SAF layer 820 also has an antiferromagnetic coupling layer 816 disposed over the first magnetic layer 814. Furthermore, a nonmagnetic spacer 840 is disposed on top of MTJ 830 and a polarizer 850 is disposed on top of the nonmagnetic spacer 840. Polarizer 850 is a magnetic layer that has a magnetic direction that may be parallel to its plane and orthogonal to the magnetic direction of the reference layer 832 and free layer 836. Polarizer 850 is provided to polarize a current of electrons ("spin-aligned electrons") applied to MTJ structure 830. A capping layer 860 can be provided on top of perpendicular polarizer 850 to protect the layers below on MTJ stack 800. In on embodiment, a hard mask 870 is deposited over capping layers 860 and is provided to pattern the underlying layers of the MTJ structure 800, using reactive ion etch (RIE) and ion beam etch processes. In one embodiment, the MTJ structure is similar to portions of a pMTJ (e.g., 100, 300, 400, etc.)

In one embodiment, a self aligned sidewall insulator masks and protects components of devices in a stack from detrimental re-deposition of etched material. In one exemplary implementation, a self aligned sidewall insulator masks and protects an insulating non-magnetic tunneling barrier layer of a MTJ from re-deposition of detrimental materials. The detrimental materials can include iridium (Ir), platinum (Pt), ruthenium (Ru) metals, and so on. This can be critical since these materials typically do not easily oxidize and can significantly damage performance if even trace amounts are otherwise re-deposited an insulating non-magnetic tunneling barrier layer of a MTJ.

In one embodiment, a multi terminal stack facilitates independent operation of devices in the multi terminal stack. In one embodiment, a self aligned multi terminal stack with multiple devices configured in a third dimension with respect to each other facilitates increased density over implementations limited to two dimensional array configuration of multiple devices. In one embodiment, a self aligned multi terminal stack with multiple devices protects against detrimental affects (e.g., re-deposition of etched materials, etc.).

Figure 10:
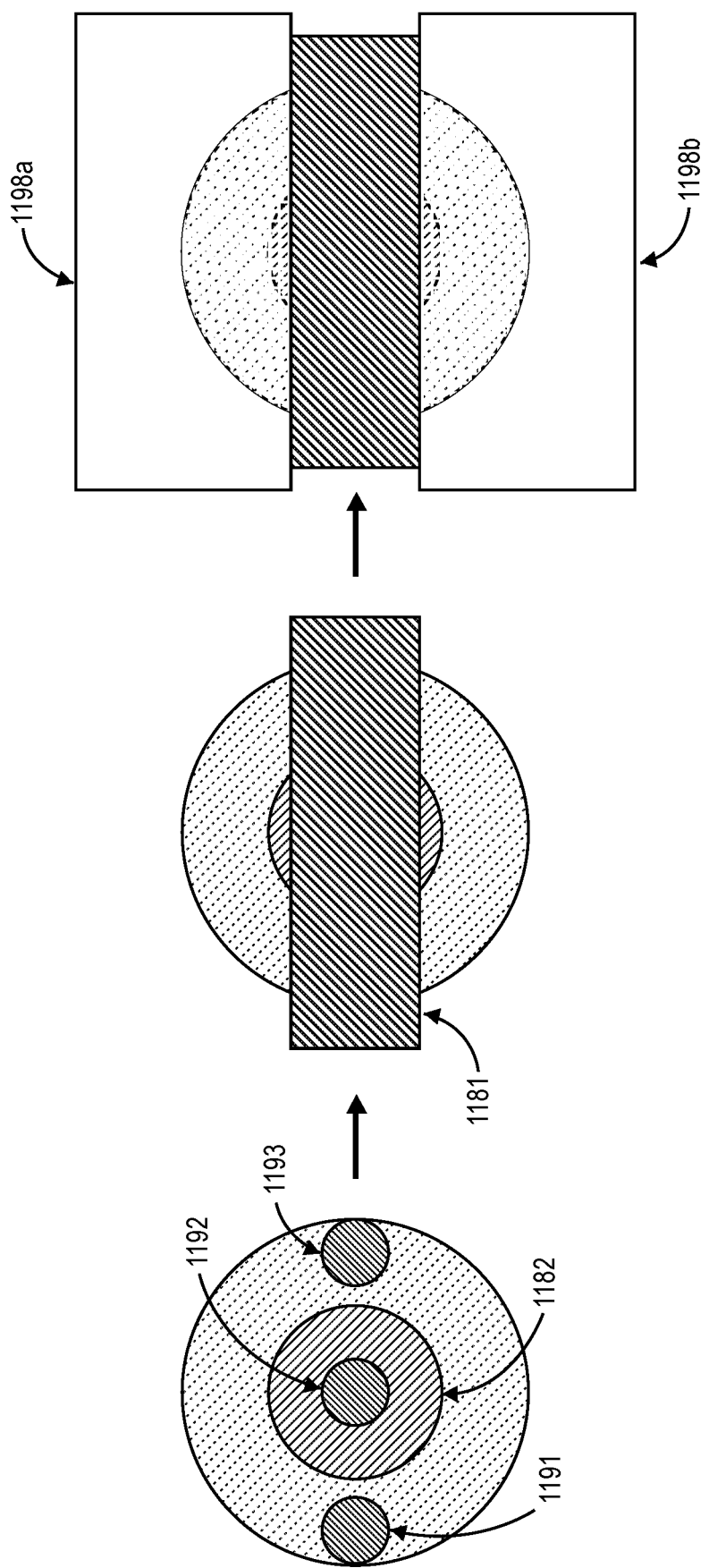
FIG. 10 is a top view block diagram of a pillar structure via coupling in accordance with one embodiment.
Figure 11:
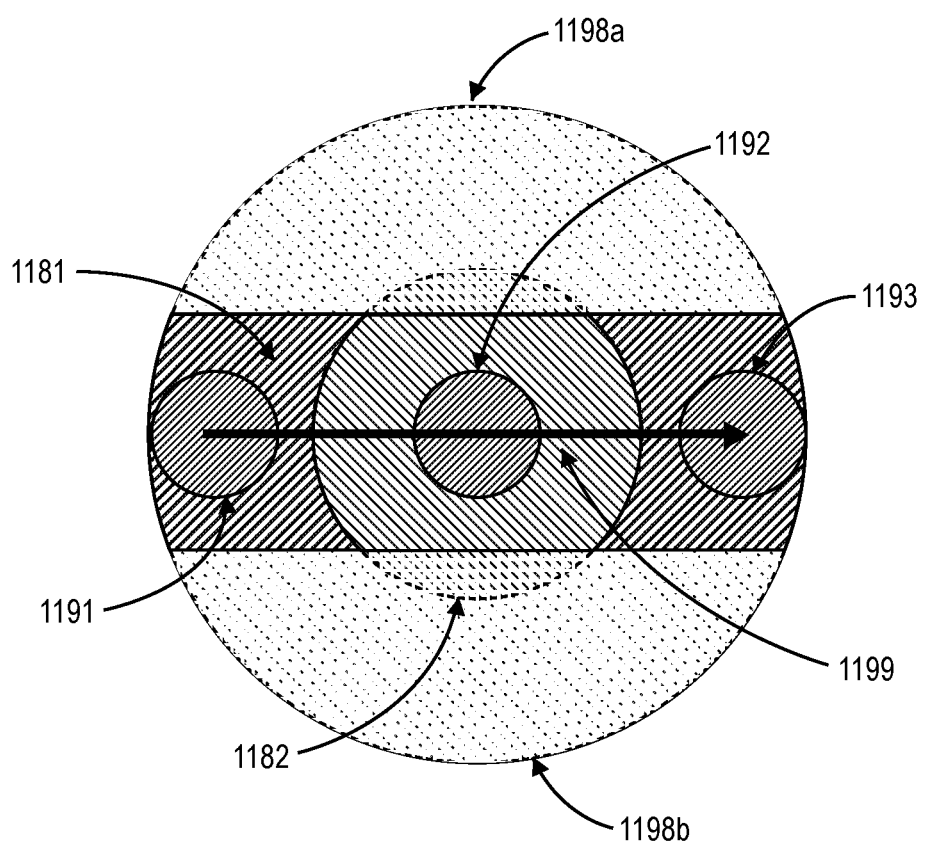
FIG. 11 is a top view block diagram of a pillar structure with current flow between vias in accordance with one embodiment.

FIG. 10 is a top view block diagram of a pillar structure via coupling in accordance with one embodiment. The Vias can be coupled independently to contiguous intermediate contact. In one exemplary implementation, the coupling is achieved through one additional lithography fabrication process. In one embodiment, the pillar includes vias 1191, 1192, and 1193, device 1182 with intermediate contact 1181, and insulators 1198a and 1198b. FIG. 11 is a top view block diagram of a pillar structure with current flow between vias in accordance with one embodiment. The current 1199 can flow from via 1191 to 1193. In one embodiment, the current flow can be oriented in the plane of the wafer between vias 1191 and 1193. In one exemplary implementation, the current flow is applied to spin hall effect devices Some portions of the detailed descriptions are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

References to "one embodiment" or "an embodiment" mean that one or more features, structures, characteristics, and so on, described in connection with the embodiment is included in at least one implementation encompassed by the present specification. Thus, appearances of the phrase "one embodiment" or "an embodiment" are not necessarily referring to the same embodiment. Furthermore, the features, structures, characteristics, and so on, may be included in other suitable forms other than the particular embodiment illustrated.

The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting. The use of the disjunctive is intended to include the conjunctive.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

It is appreciated that embodiments of the present invention can be compatible and implemented with a variety of different types of tangible memory or storage (e.g., RAM, DRAM, flash, hard drive, CD, DVD, etc.). The memory or storage, while able to be changed or rewritten, can be considered a non-transitory storage medium. By indicating a non-transitory storage medium it is not intend to limit characteristics of the medium, and can include a variety of storage mediums (e.g., programmable, erasable, nonprogrammable, read/write, read only, etc.) and "non-transitory" computer-readable media comprises all computer-readable media, with the sole exception being a transitory, propagating signal.

It is appreciated that the following is a listing of exemplary concepts or embodiments associated with the novel approach. It is also appreciated that the listing is not exhaustive and does not necessarily include all possible implementation. The following concepts and embodiments can be implemented in hardware. In one embodiment, the following methods or process describe operations performed by various processing components or units. In one exemplary implementation, instructions, or directions associated with the methods, processes, operations etc. can be stored in a memory and cause a processor to implement the operations, functions, actions, etc.

It is appreciated that a memory storage management systems and methods can include the following exemplary concepts or embodiments. It is also appreciated that the listing is not exhaustive and does not necessarily include all possible implementations. The following concepts and embodiments can be implemented in hardware, firmware, software, and so on. In one embodiment, the following concepts include methods or processes that describe operations performed by various processing components or units. In one exemplary implementation, instructions or directions associated with the methods, processes, operations etc. can be stored in a memory and cause a processor to implement the operations, functions, actions, etc.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents. The listing of steps within method claims do not imply any particular order to performing the steps, unless explicitly stated in the claim.

What is claimed is:

1. A semiconductor comprising:
   a first device at a first semiconductor level within a multi terminal device stack, wherein the first device is coupled to a first terminal;
   a second device at a second semiconductor level within the multi terminal device stack, wherein the second device is coupled to a second terminal;
   an intermediate contact layer in the multi terminal device stack, the intermediate contact layer being coupled to the first device and second device;
   a first insulator formed adjacent and wrapped around the first device;
   a second insulator formed adjacent and wrapped around the second device; and
   a third terminal formed adjacent and wrapped around at least a part of the sidewall of the multi terminal device stack, the third terminal being formed adjacent the intermediate contact layer and the second insulator and adjacent at least a part of the first insulator, wherein the first terminal is coupled to the first device on a first side of the multi terminal device stack and the second terminal is coupled to the second device on a second side of the multi terminal device stack, opposite the first side, and the third terminal is coupled to the intermediate contact layer and isolated from sidewalls of the first device and the second device by the first and second insulators.

2. The semiconductor of claim 1, wherein the third terminal is coupled to components not included in the multi terminal device stack through a via formed on the second side.

3. The semiconductor of claim 1, wherein the first terminal, the second terminal, and the third terminal couple components included in the multi terminal device stack to components not included in the multi terminal device stack.

4. The semiconductor of claim 3, wherein the components in the multi terminal device stack are otherwise electrically isolated from the components not in the multi terminal device stack.

5. The semiconductor of claim 1, wherein the third terminal is located on a third side of the multi terminal device stack.

6. The semiconductor of claim 1, wherein the first device is stacked above the second device within the multi terminal device stack.

7. The semiconductor of claim 1, wherein the first device and second device are active devices.

8. The semiconductor of claim 1, wherein the first device and second device are magnetic tunnel junction (MTJ) devices.

9. The semiconductor of claim 1, wherein the first device and second device are heterojunction bipolar transistors.

10. The semiconductor of claim 1, wherein:
the first device is a first MTJ device;
a second device is a second MTJ device; and
the third terminal is coupled to the first device and second device through the intermediate contact layer.

11. The semiconductor of claim 10, wherein the first terminal, the second terminal, and the third terminal couple components included in the multi terminal device stack to components not included in the multi terminal device stack.

12. The semiconductor of claim 1, wherein the first terminal is coupled to a first side of the multi terminal device stack, the second terminal is coupled to a second side of the multi terminal device stack, and the third terminal is coupled on a third side of the multi terminal device stack, wherein the first side is a top side and the second side is a bottom side.

13. The semiconductor of claim 10, wherein the first MTJ device is operable to store a first logical bit of information and the second MTJ device is operable to store a second logical bit of information, wherein respective states of the first MTJ device and the second MTJ device convey a logical state of respective logical bit of information.

14. The semiconductor of claim 1, wherein the multi terminal device stack is less than or equal to 100 nanometers from another multi terminal device stack.

15. The semiconductor of claim 1, wherein an angle between a sidewall of the multi terminal device stack and a line from the base of the multi terminal device stack to the top of another multi terminal device stack is less than 50 degrees.

16. The semiconductor of claim 12, where in the third terminal is formed on the sidewall of the multi terminal device stack and extends from the second side to the first side, the third terminal extending to and covering a part of the first insulator.

\* \* \* \* \*